United States Patent
Takahashi et al.

(10) Patent No.: US 9,484,296 B2
(45) Date of Patent: Nov. 1, 2016

(54) SELF-ALIGNED INTEGRATED LINE AND VIA STRUCTURE FOR A THREE-DIMENSIONAL SEMICONDUCTOR DEVICE

(71) Applicant: SANDISK TECHNOLOGIES INC., Plano, TX (US)

(72) Inventors: Akihide Takahashi, Yokkaichi (JP); Ryoichi Honma, Tokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/620,593

(22) Filed: Feb. 12, 2015

(65) Prior Publication Data
US 2016/0240476 A1 Aug. 18, 2016

(51) Int. Cl.
H01L 23/522 (2006.01)
H01L 23/528 (2006.01)
H01L 23/535 (2006.01)
H01L 21/768 (2006.01)
H01L 27/115 (2006.01)

(52) U.S. Cl.
CPC ..... H01L 23/5226 (2013.01); H01L 21/76802 (2013.01); H01L 21/76843 (2013.01); H01L 21/76877 (2013.01); H01L 21/76883 (2013.01); H01L 23/5283 (2013.01); H01L 21/76829 (2013.01); H01L 27/11556 (2013.01); H01L 27/11582 (2013.01)

(58) Field of Classification Search
None
See application file for complete search history.

(56) References Cited

U.S. PATENT DOCUMENTS 5,915,167 A  6/1999 Leedy
6,759,333 B2 * 7/2004 Okajima ........... H01L 21/76802
                                              257/379

(Continued)

FOREIGN PATENT DOCUMENTS

WO   WO02/15277 A1   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

Primary Examiner — Phat X Cao
Assistant Examiner — Diana C Vieira
(74) Attorney, Agent, or Firm — The Marbury Law Group PLLC

(57) ABSTRACT

At least one via level dielectric layer and at least one line level dielectric layer are sequentially formed over an array of device structures. Conductive line structures are formed within the at least one line level dielectric layer. A mask layer is applied over the conductive line structures, and is lithographically patterned to form opening therein. Portions of the conductive line structures are removed from underneath the openings in the patterned mask layer to form via cavities. The via cavities are vertically extended through the at least one via level dielectric layer employing a combination of the mask layer and the at least one line level dielectric layer as an etch mask. At least one conductive material can be deposited in the via cavities to form conductive via structures, which, in conjunction with the conductive line structures, constitute integrated line and via structures.

40 Claims, 32 Drawing Sheets

(56) References Cited

U.S. PATENT DOCUMENTS

| | | |
|---|---|---|
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,349,681 B2 | 1/2013 | Alsmeier et al. |
| 8,658,499 B2 | 2/2014 | Makala et al. |
| 2007/0210338 A1 | 9/2007 | Orlowski |
| 2007/0252201 A1 | 11/2007 | Kito et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0198687 A1 | 8/2011 | Lee |
| 2011/0266606 A1 | 11/2011 | Park et al. |
| 2011/0280077 A1 | 11/2011 | Fishburn |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0092926 A1 | 4/2012 | Whang |
| 2012/0146122 A1 | 6/2012 | Whang et al. |
| 2013/0264631 A1 | 10/2013 | Alsmeier et al. |
| 2013/0313627 A1 | 11/2013 | Lee et al. |
| 2014/0138760 A1 | 5/2014 | Makala et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Cell," IEDM Proc. (2001) pp. 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report and Written Opinion, International Application No. PCT/US2011/042566, issued Jan. 17, 2012.

Invitation to Pay Additional Fees & Partial International Search Report, PCT/US2011/042566, issued Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, issued Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Search Report and Written Opinion, International Application No. PCT/US2013/048508, issued Sep. 18, 2013.

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

Diaz, "Low-$k$ Dielectrics: Materials and Process Technology," EE518, Penn State University, Apr. 13, 2006.

Saraswat, "Low-$k$ Dieletrics," Department of Electrical Engineering, Stanford University, Jul. 2008.

Rabkin, P. et al., "Three Dimensional Nand Devices with Air Gap or Low-K Core," U.S. Appl. No. 14/326,298, filed Jul. 8, 2014.

Rabkin, P. et al., "Vertical Memory Device with Bit Line Air Gap," U.S. Appl. No. 14/498,033, filed Sep. 26, 2014.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

\* cited by examiner

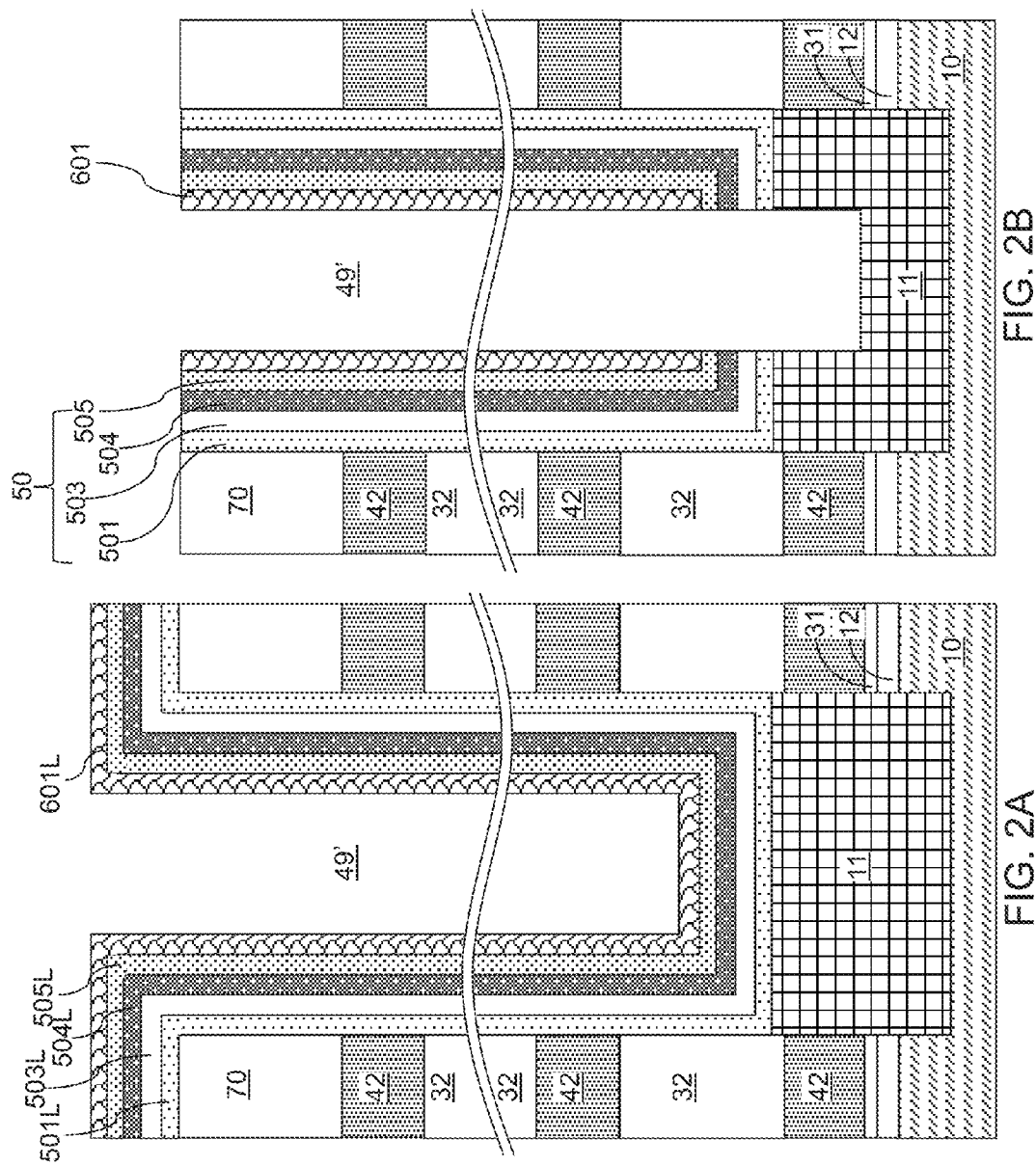

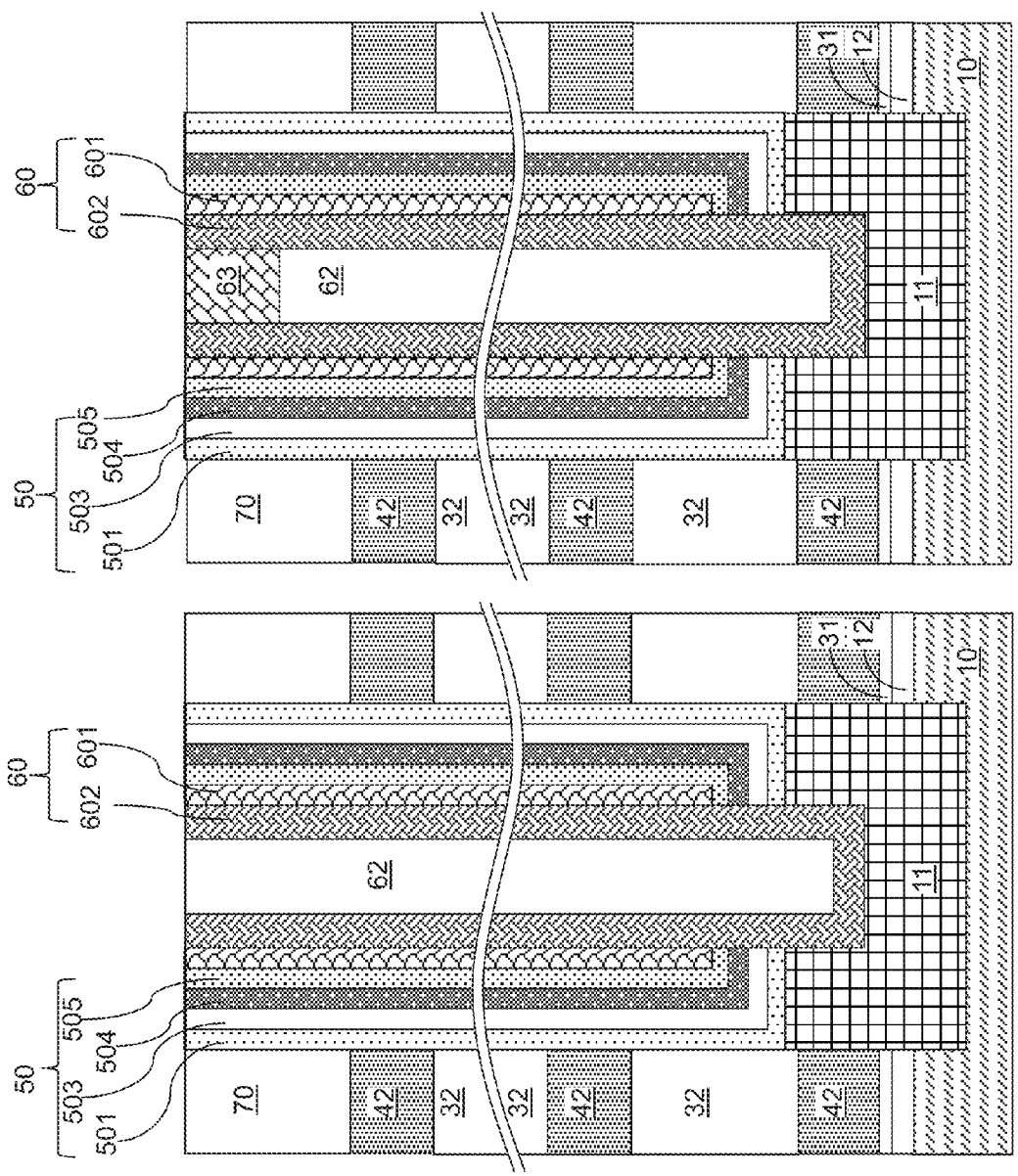

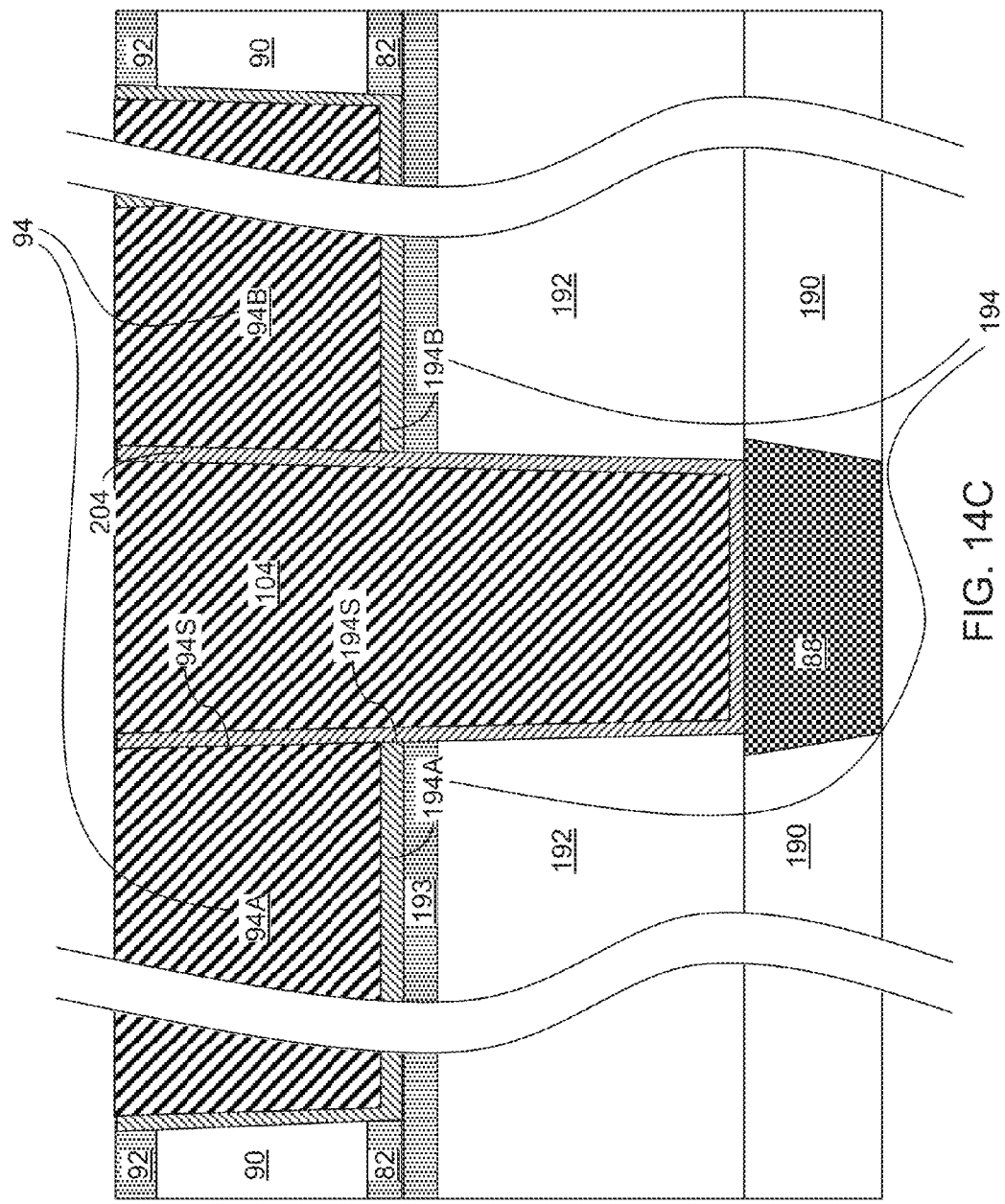

SELF-ALIGNED INTEGRATED LINE AND VIA STRUCTURE FOR A THREE-DIMENSIONAL SEMICONDUCTOR DEVICE

FIELD

The present disclosure relates generally to the field of semiconductor devices and specifically to metal interconnect structures for providing electrical connection to three-dimensional semiconductor devices, such as vertical NAND strings, and methods of making thereof.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. For example, a 3D NAND stacked memory device may include a high density of bit lines electrically connected to respective drain regions through underlying contact via structures. Misalignment between the contact via structures and the bit lines can cause undesirable electrical shorts or electrical opens.

SUMMARY

According to an aspect of the present disclosure, a structure is provided, which includes at least one via level dielectric layer overlying a substrate, at least one line level dielectric layer located above the at least one via level dielectric layer, and an integrated line and via structure comprising a first line structure and a via structure in contact with each other. The first line structure contacts sidewalls of the at least one line level dielectric layer and a top surface of the at least one via level dielectric layer. The via structure comprises a conductive via liner contacting a sidewall of the at least one via level dielectric layer, a sidewall of the at least one line level dielectric layer. A sidewall of the first line structure, and further comprises a conductive via fill material portion embedded within the conductive via liner.

According to another aspect of the present disclosure, a monolithic three-dimensional NAND memory device is provided, which comprises a stack of alternating layers comprising electrically insulating layers and electrically conductive layers and located over a substrate, a memory opening extending through the stack, a memory film and a semiconductor channel located within the memory opening, at least one via level dielectric layer overlying the stack, at least one via level dielectric layer overlying the at least one via level dielectric layer, at least one line level dielectric layer located above the at least one via level dielectric layer, and an integrated line and via structure comprising a first line structure and a via structure in contact with each other. The via structure comprises a conductive via liner contacting a sidewall of the at least one via level dielectric layer, a sidewall of the at least one line level dielectric layer, and a sidewall of the first line structure, and further comprises a conductive via fill material portion embedded within the conductive via liner.

According to yet another aspect of the present disclosure, a method of manufacturing a metal interconnect structure is provided. At least one via level dielectric layer is formed over a substrate. At least one line level dielectric layer is formed over the at least one via level dielectric layer. A line structure is formed within the at least one line level dielectric layer. A patterned photoresist layer including an opening is formed over the at least one line level dielectric layer and the line structure. The opening in the patterned photoresist layer overlies a portion of the line structure. A via cavity extending through the line structure and the at least one via level dielectric layer is formed by etching a portion of the line structure underlying the opening and a portion of the at least one via level dielectric layer underlying the opening. A via structure is formed in the via cavity. An integrated line and via structure comprising remaining portions of the line structure and the via structure is formed within a stack of the at least one via level dielectric layer and the at least one line level dielectric layer.

BRIEF DESCRIPTION OF THE DRAWINGS

FIGS. 2A-2F are sequential vertical cross-sectional views of a memory opening within the exemplary structure during various processing steps employed to form a memory stack structure according to an embodiment of the present disclosure.

FIG. 12C contains a cut-away view through mask layer 107 along one bit line structure in region C.

FIG. 14C is another vertical cross-sectional view of the magnified region M of FIG. 14A.

DETAILED DESCRIPTION

Figure 1:
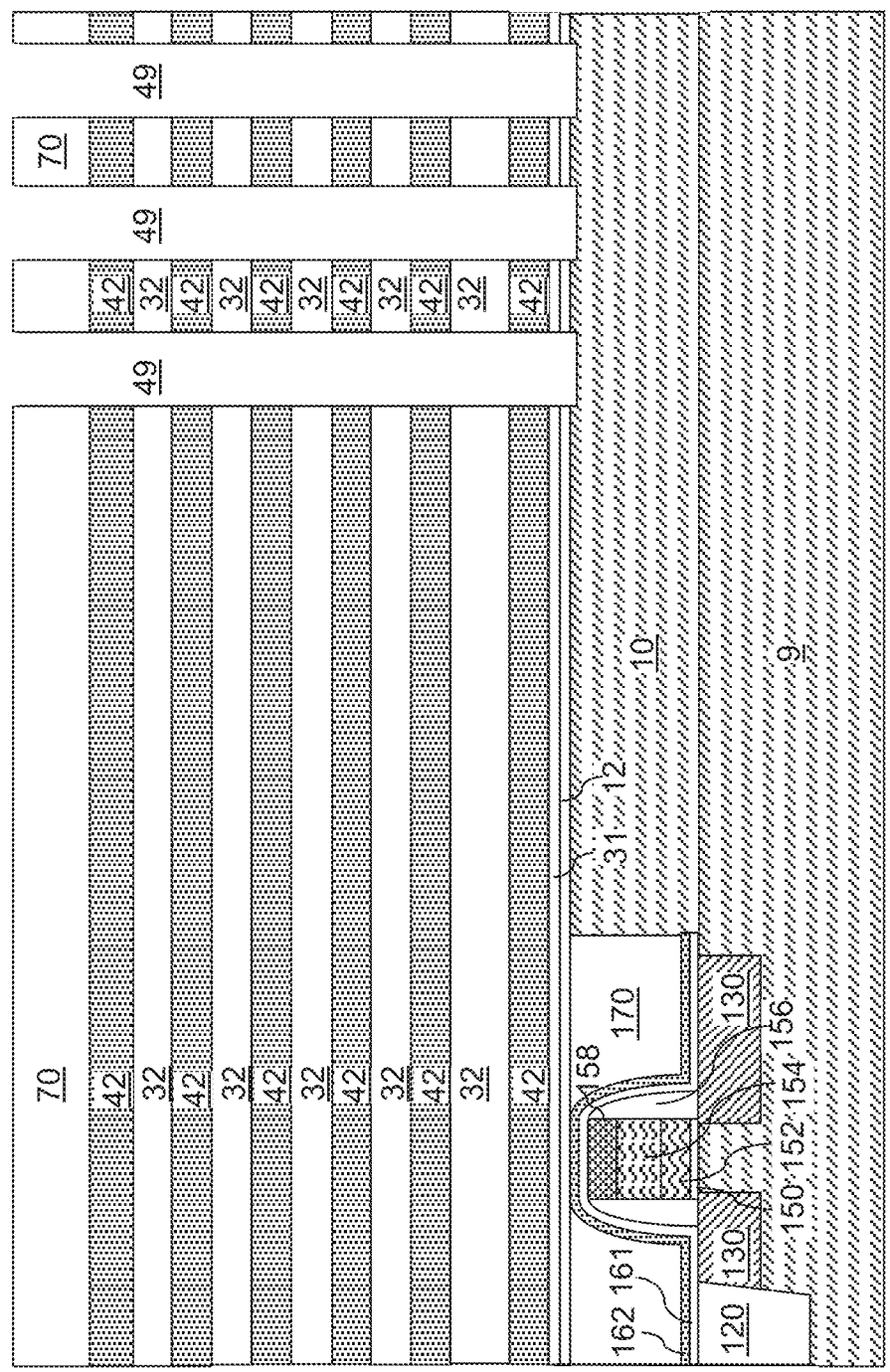
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

An epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer SOIL. The second blocking dielectric layer 503L can include a dielectric material that is different from the dielectric material of the first blocking dielectric layer SOIL. In one embodiment, the second blocking dielectric layer 503L can include silicon oxide, a dielectric metal oxide having a different composition than the first blocking dielectric layer SOIL, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5051, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 505, the charge storage element 504, and the at least one blocking dielectric (501, 503). Optionally, the physically exposed portion of the epitaxial channel portion 11 can be vertically recessed. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2C:
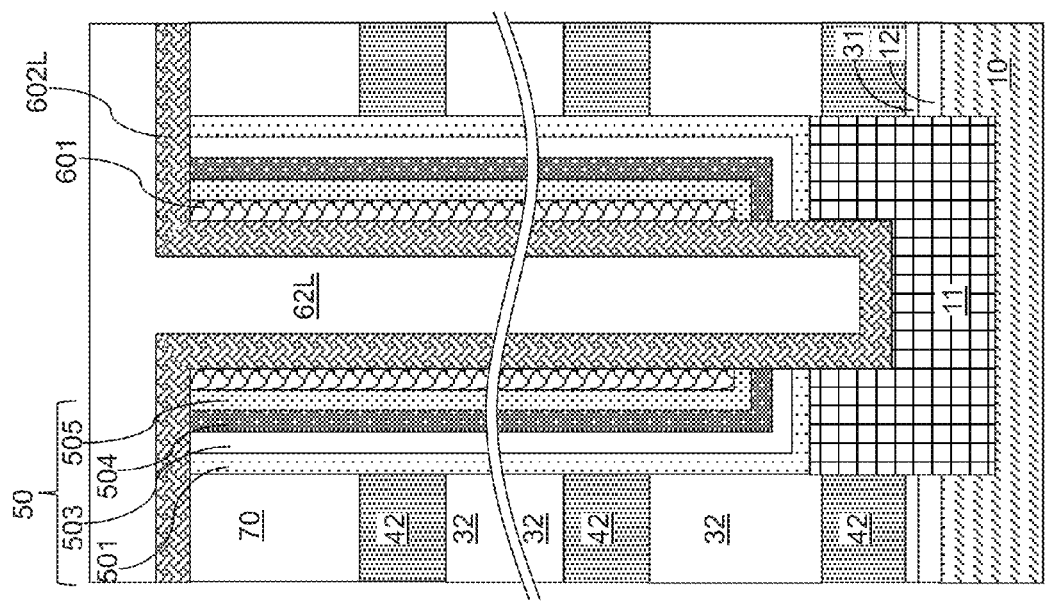

Referring to FIG. 2C, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2D:
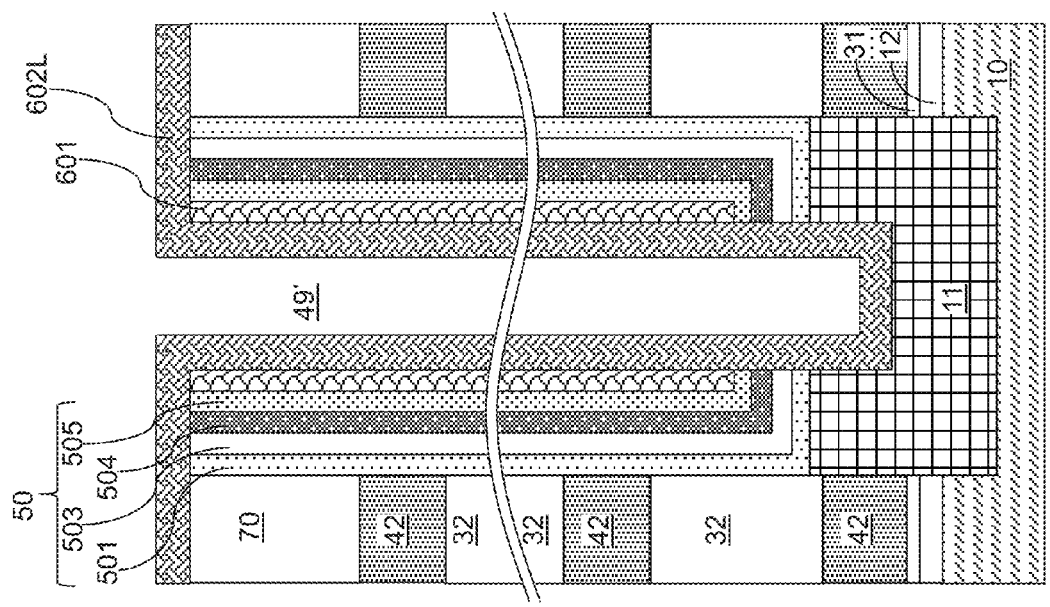

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
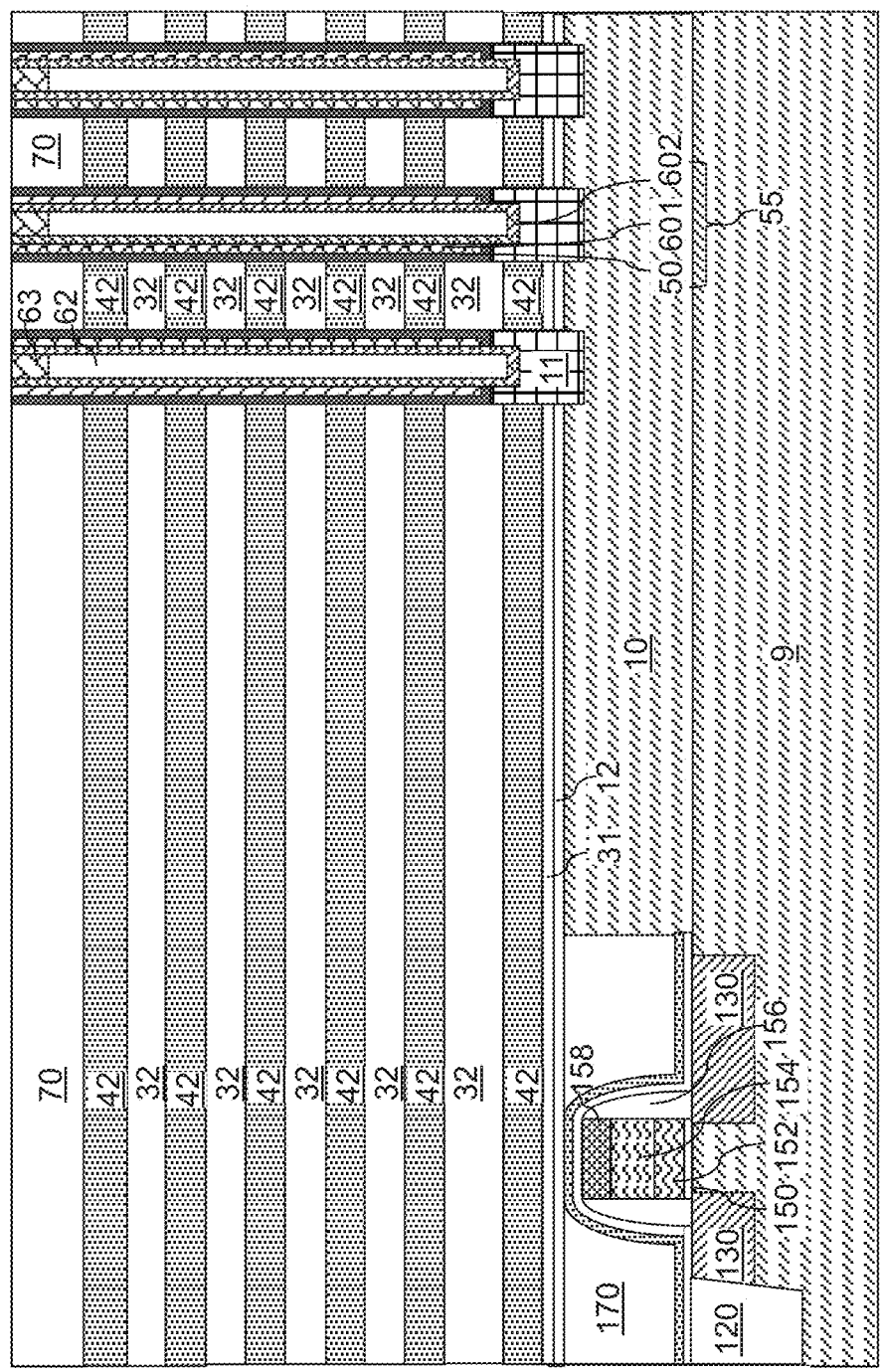
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
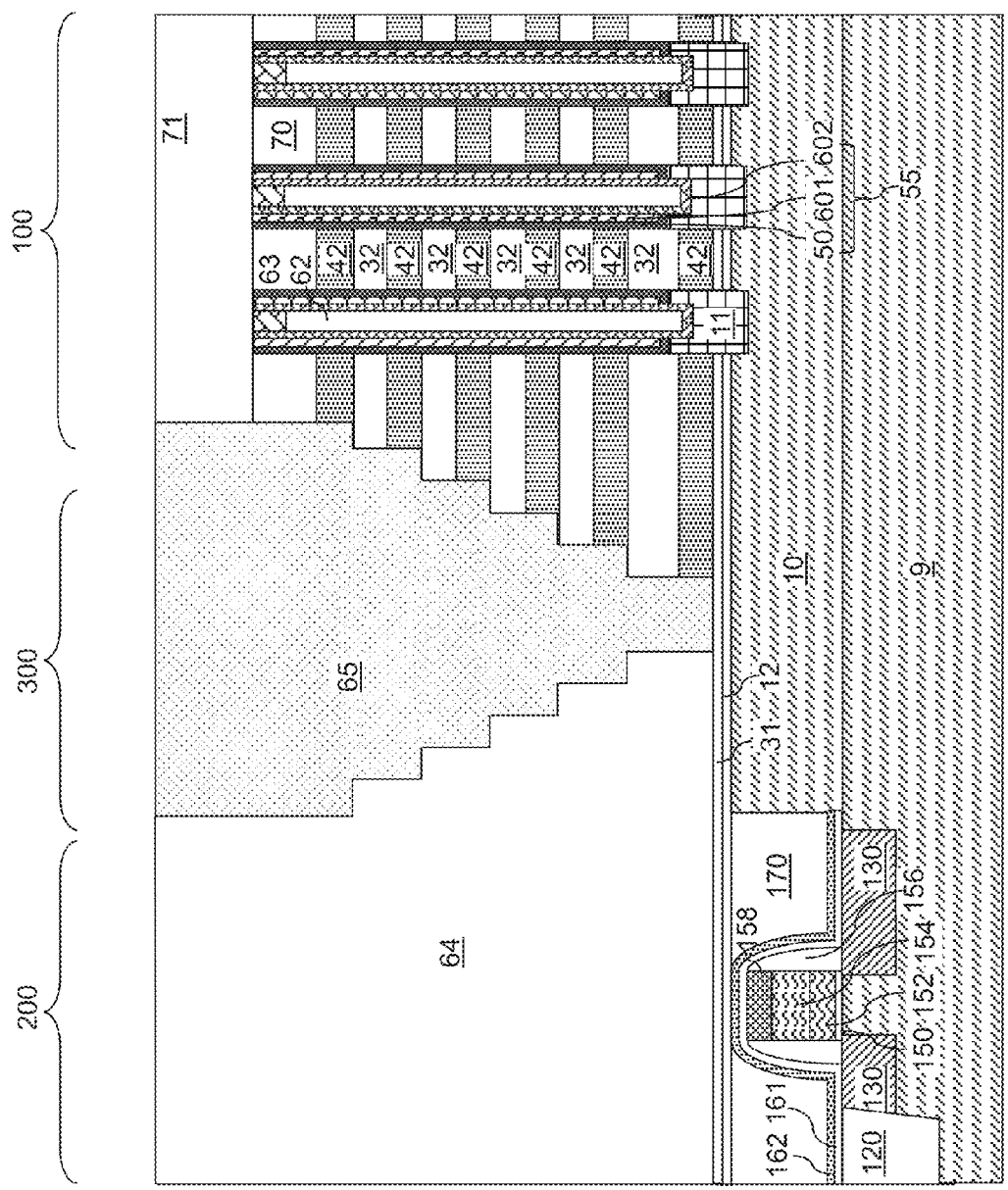
FIG. 4 is a vertical cross-sectional view of the exemplary structure after formation of a stepped terrace and a retro-stepped dielectric material portion according to an embodiment of the present disclosure.

Referring to FIG. 4, an optional first dielectric cap layer 71 can be formed over the substrate (9, 10). As an optional structure, the first dielectric cap layer 71 may, or may not, be formed. In case the first dielectric cap layer 71 is formed, the first dielectric cap layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first dielectric cap layer 71 can be formed over a horizontal plane including the top surface of the insulating cap layer 70 and the top surfaces of the drain regions 63. The first dielectric cap layer 71 can be deposited by chemical vapor deposition, atomic layer deposition (ALD), spin-coating, or a combination thereof. The thickness of the first dielectric cap layer 71 can be in a range from 10 nm to 300 nm, although lesser and greater thicknesses can also be employed.

In one embodiment, the first dielectric cap layer 71 can be formed as a dielectric material layer having a uniform thickness throughout. The first dielectric cap layer 71 may be formed as a single dielectric material layer, or can be formed as a stack of a plurality of dielectric material layers. Alternatively, formation of the first dielectric cap layer 71 may be merged with formation of at least one line level dielectric layer (not shown). While the present disclosure is described employing an embodiment in which the first dielectric cap layer 71 is a structure separate from an optional second dielectric cap layer or at least one line level dielectric layer to be subsequently deposited, embodiments in which the first dielectric cap layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first dielectric cap layer 71 by a planarization process such as chemical mechanical planarization and/or a recess etch. The top surfaces of the first dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
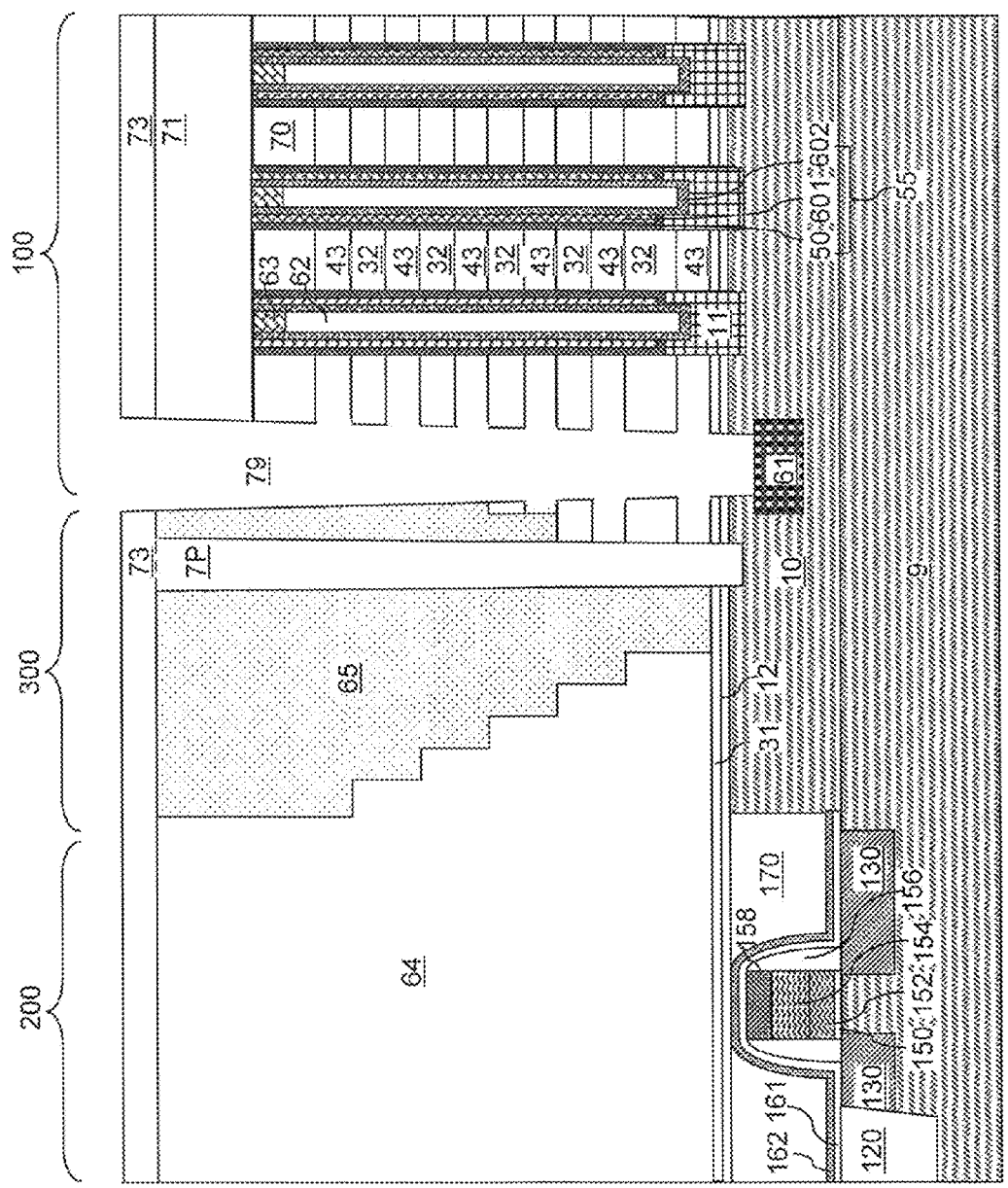
FIG. 5A is a vertical cross-sectional view of the exemplary structure after formation of a backside via cavity and backside recesses according to an embodiment of the present disclosure.
Figure 5B:
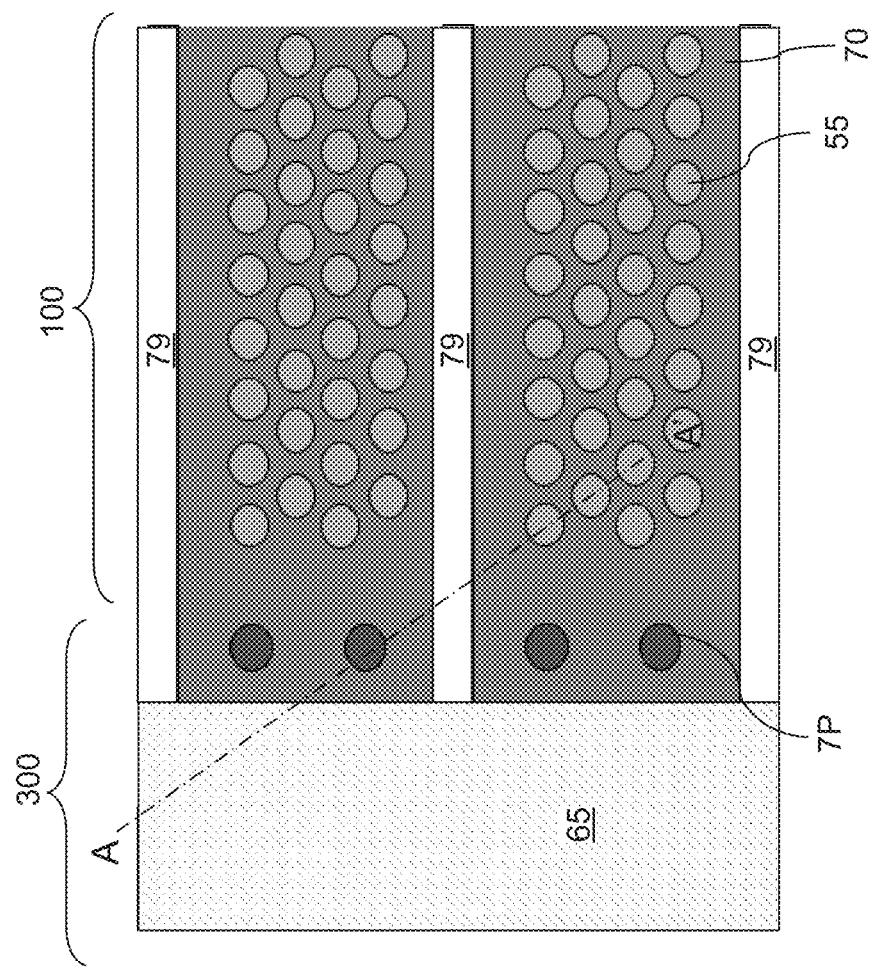
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first dielectric cap layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first dielectric cap layer 71 concurrently with deposition of the at least one dielectric support pillar 7P can be present over the first dielectric cap layer 71 as a optional second dielectric cap layer 73. Each of the at least one dielectric support pillar 7P and the optional second dielectric cap layer 73 is an optional structure. As such, the optional second dielectric cap layer 73 may, or may not, be present over the insulating cap layer 70 and the retro-stepped dielectric material portion 65. The first dielectric cap layer 71 and the optional second dielectric cap layer 73 are herein collectively referred to as at least one dielectric cap layer (71, 73). In one embodiment, the at least one dielectric cap layer (71, 73) can include both the first and second dielectric cap layers (71, 73), and optionally include any additional via level dielectric layer that can be subsequently formed. In another embodiment, the at least one dielectric cap layer (71, 73) can include only the first dielectric cap layer 71 or the optional second dielectric cap layer 73, and optionally include any dielectric layer that can be subsequently formed. Alternatively, formation of the first and second dielectric cap layers (71, 73) may be omitted, and at least one via level dielectric layer may be subsequently formed, i.e., after formation of a backside contact via structure.

The second dielectric cap layer 73 and the at least one dielectric support pillar 7P can be formed as a single contiguous structure of integral construction, i.e., without any material interface therebetween. In another embodiment, the portion of the dielectric material that is deposited over the first dielectric cap layer 71 concurrently with deposition of the at least one dielectric support pillar 7P can be removed, for example, by chemical mechanical planarization or a recess etch. In this case, the second dielectric cap layer 73 is not present, and the top surface of the first dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region 61 may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses 43.

Figure 6:
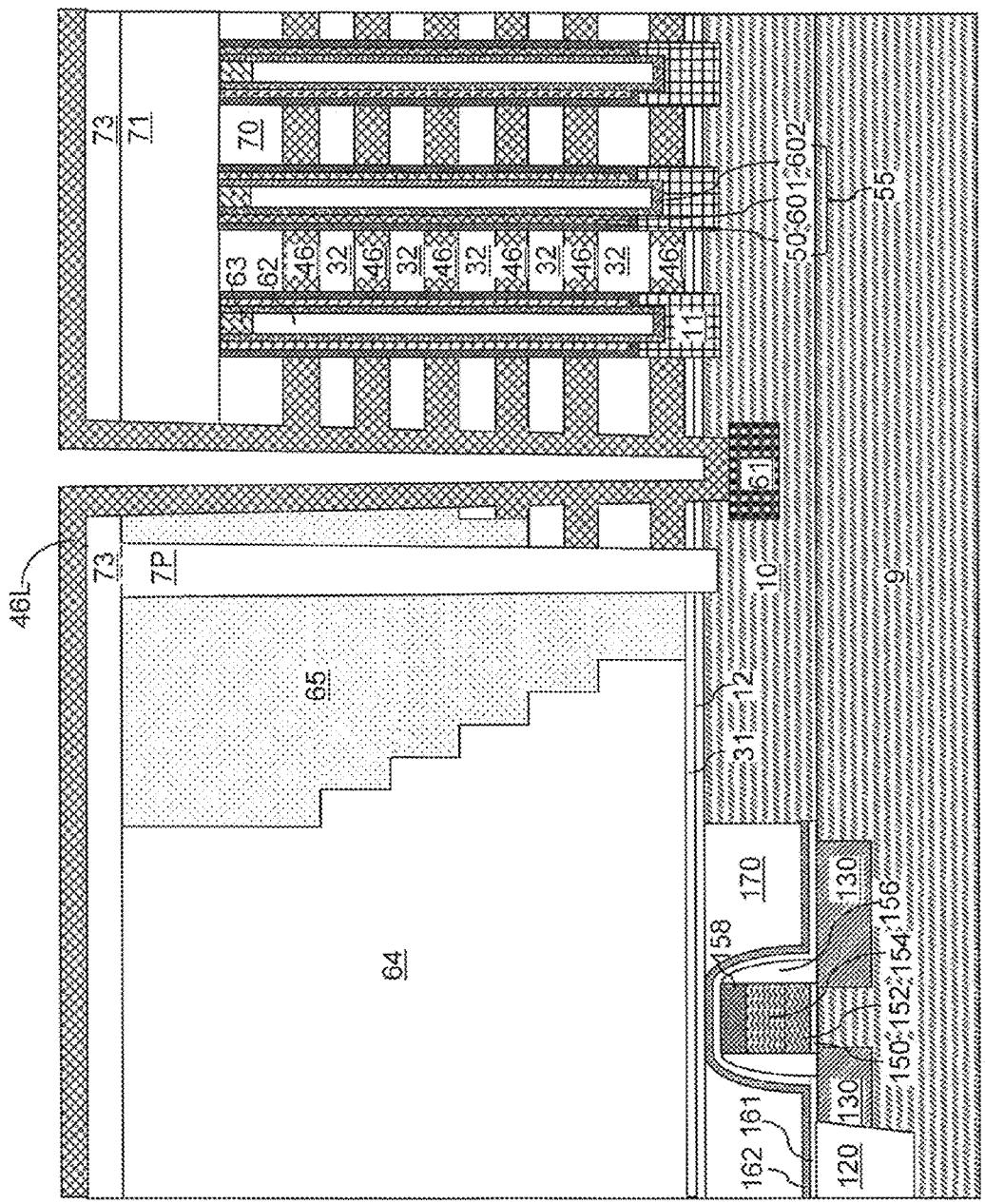
FIG. 6 is a vertical cross-sectional view of the exemplary structure after formation of electrically conductive lines according to an embodiment of the present disclosure.

Referring to FIG. 6, a conductive material can be deposited in the plurality of backside recesses 43, on sidewalls of the at least one the backside contact trench 79, and over the top surface of the optional second dielectric cap layer 73 (or the topmost layer of the first dielectric cap layer 71 if the second dielectric cap layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 can be formed in the plurality of backside recesses 43, and a contiguous conductive material layer 46L can be formed on the sidewalls of each backside contact trench 79 and over the optional second dielectric cap layer 73 (or the topmost layer of the exemplary structure in case the second dielectric cap layer 73 is not employed). Thus, at least a portion of each sacrificial material layer 42 can be replaced with an electrically conductive layer 46, which is a conductive material portion.

Figure 7A:
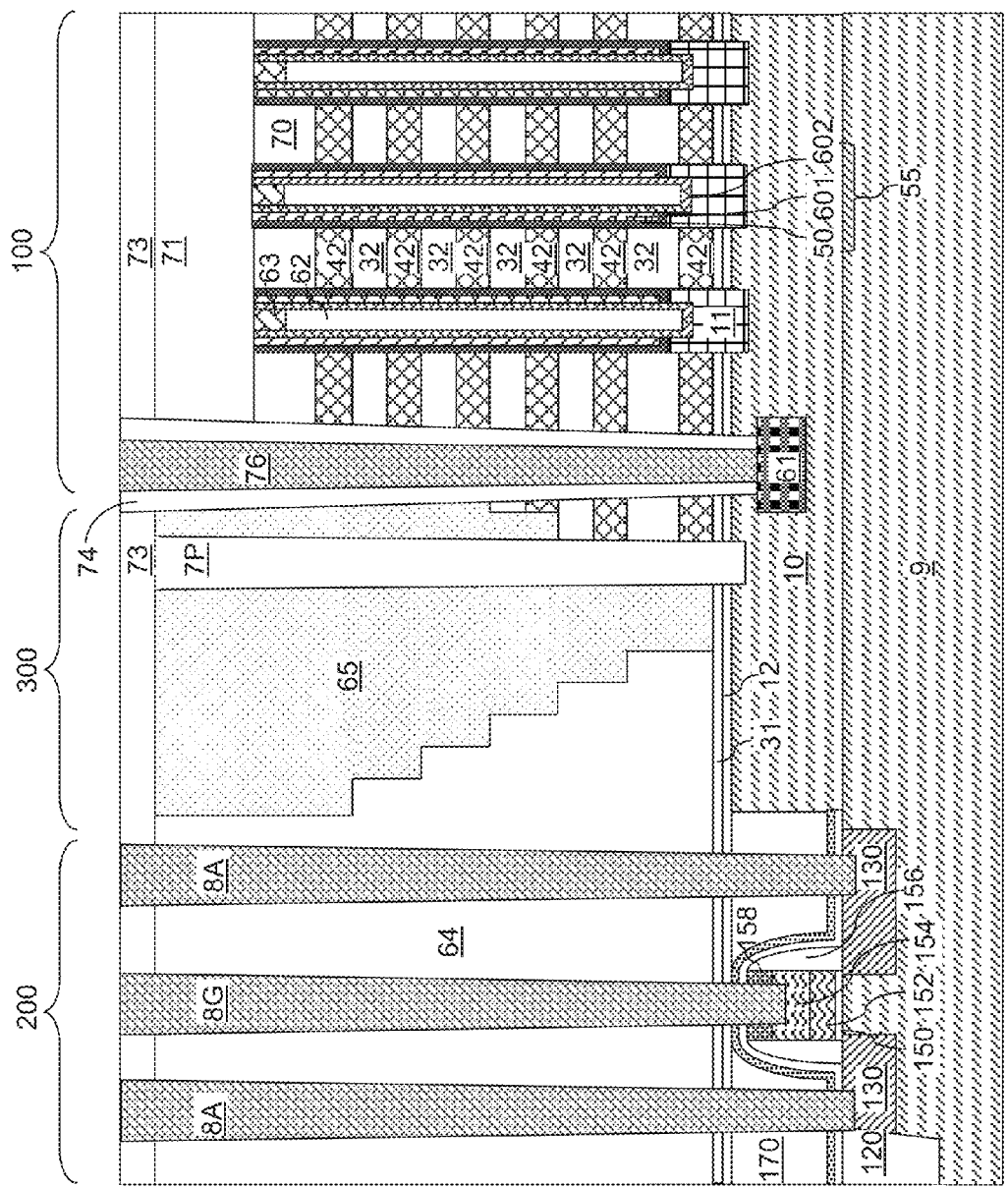
FIGS. 7A and 7B are vertical cross-sectional views of the exemplary structure after formation of a backside insulator spacer, a backside contact via structure, and various contact via structures according to an embodiment of the present disclosure.
Figure 7B:
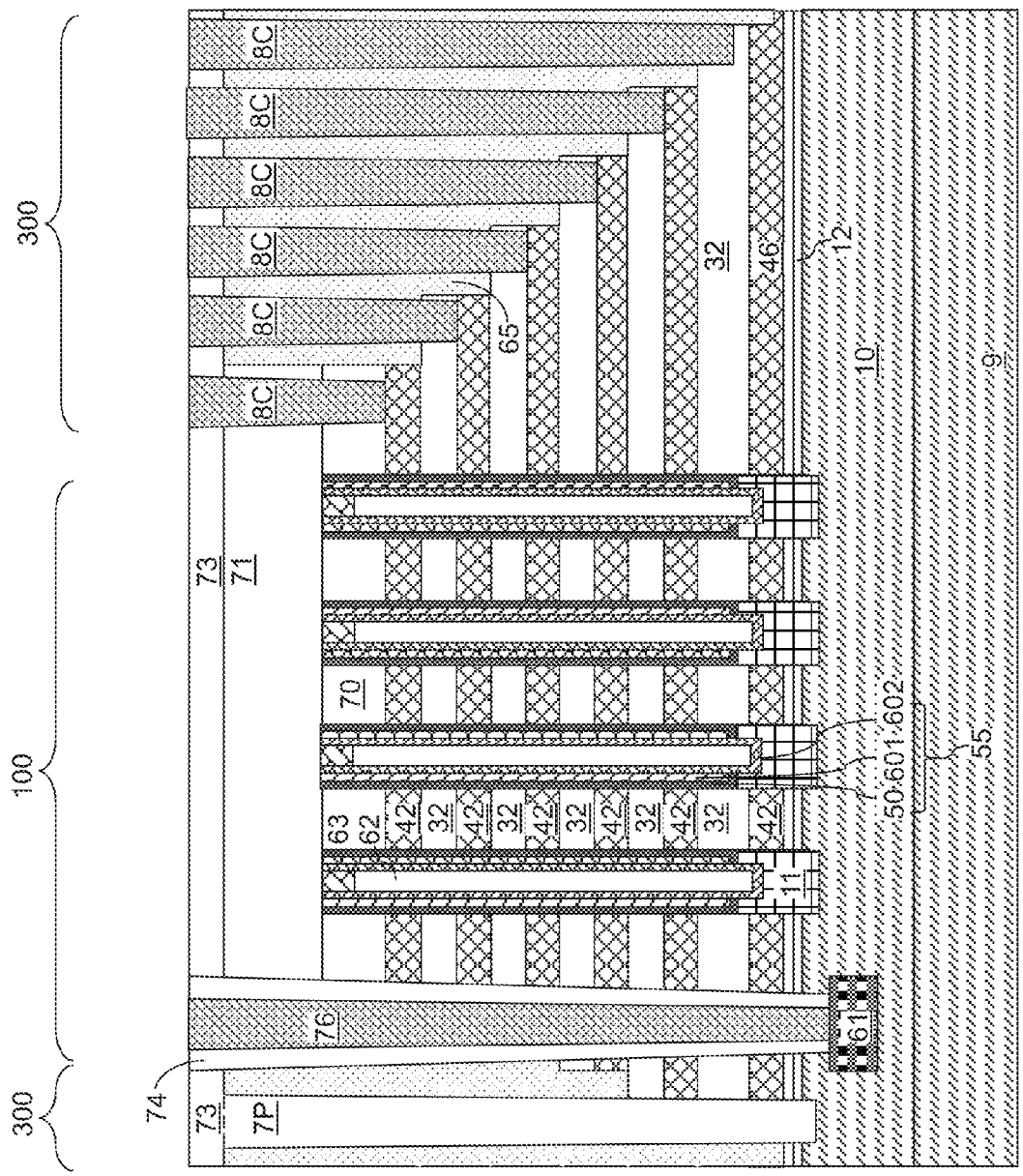

Referring to FIGS. 7A and 7B, the deposited conductive material of the contiguous conductive material layer 46L is etched back from the sidewalls of each backside contact trench 79 and from above the optional second dielectric cap layer 73 (or the topmost layer of the exemplary structure in case the second dielectric cap layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the optional second dielectric cap layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the optional second dielectric cap layer 73 to the bottom surface of the gate via cavity, can be less than the vertical distance between the top surface of the optional second dielectric cap layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

The cavity laterally surrounded by the insulating spacer 74, the various via cavities in the peripheral device region 200, and the control gate contact via cavities in the contact region 300 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region contact via structure 8A is formed in each active region via cavity in the peripheral device region 200. Further, control gate contact via structures 8C can be formed within each contact via cavity that extends to a top surface of the electrically conductive layers 46 in the contact region 300.

Figure 8A:
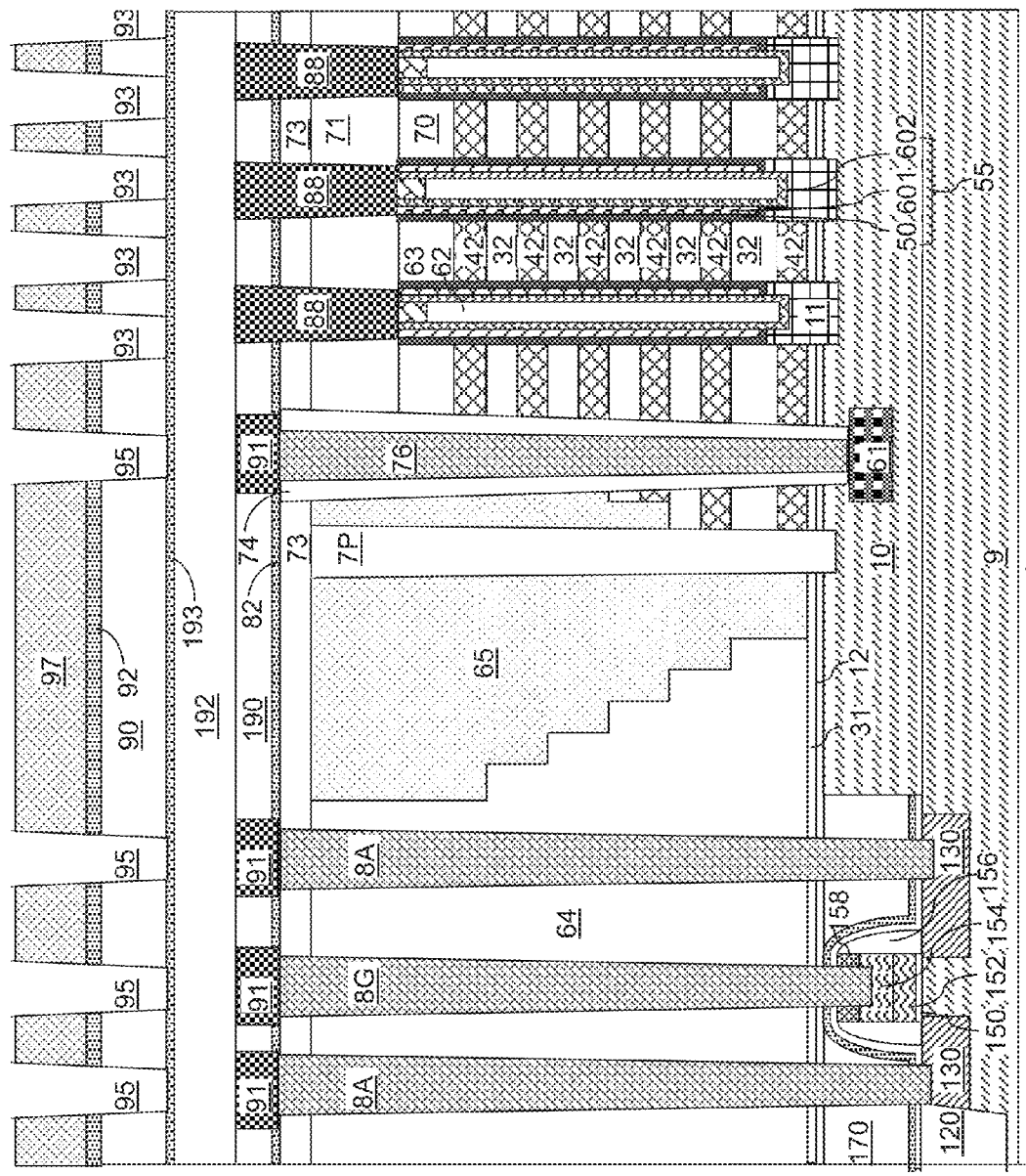
FIGS. 8A and 8B are vertical cross-sectional views of regions of the exemplary structure after formation of at least one line level dielectric layer according to an embodiment of the present disclosure.
Figure 8B:
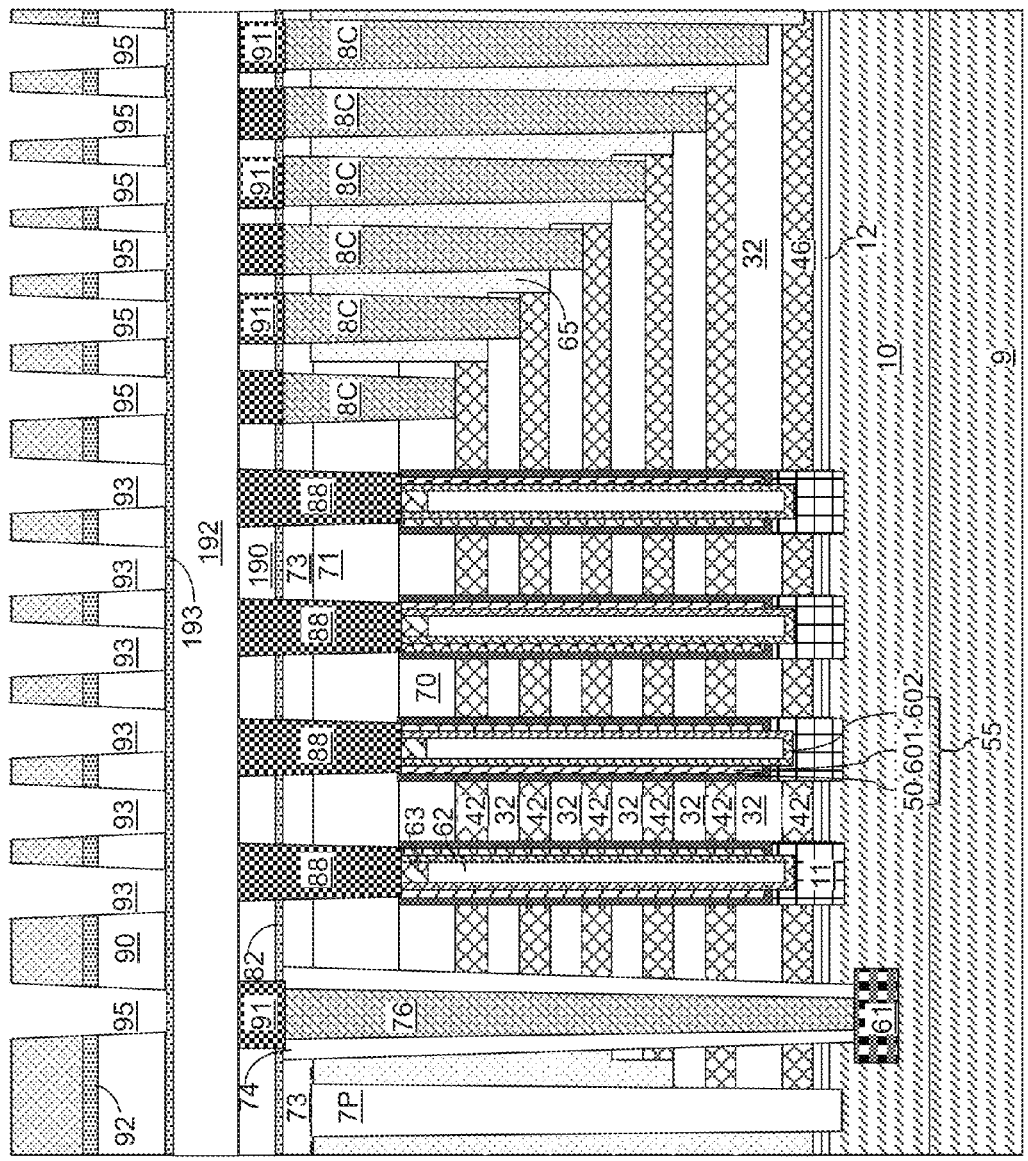

Referring to FIGS. 8A and 8B, at least one contact level dielectric layer (82, 190) can be deposited over the at least one dielectric cap layer (71, 73). The at least one contact level dielectric layer (82, 190) comprises a dielectric material such as silicon oxide, silicon nitride, silicon oxynitride, and/or organosilicate glass. In one embodiment, the at least one contact level dielectric layer (82, 190) can include a contact level etch stop dielectric layer 82 and a contact level dielectric material layer 190. A contact level etch stop dielectric layer 82, if present, can include silicon nitride or nitrogen-doped organosilicate glass, and can have a thickness in a range from 1 nm to 30 nm, and can function as an etch stop layer for an anisotropic etch process that etches via cavities through the contact level dielectric material layer 190. The contact level dielectric material layer 190 includes a dielectric material such as silicon oxide or porous or non-porous organosilicate glass (OSG). The thickness of the contact level dielectric material layer 190 can be in a range from 50 nm to 300 nm, although lesser and greater thicknesses can also be employed. The contact level dielectric material layer 190 can be deposited, for example, by chemical vapor deposition or spin coating.

Drain contact via cavities can be formed through the at least one contact level dielectric layer (82, 190) and the at least one dielectric cap layer (71, 73) by application of a photoresist layer over the at least one contact level dielectric layer (82, 190), lithographic patterning of the photoresist layer to form openings in areas overlying the memory stack structures 55, and an anisotropic etch that etches physically exposed portions of the at least one contact level dielectric layer (82, 190) and the at least one dielectric cap layer (71, 73) employing the patterned photoresist layer as an etch mask. The photoresist layer can be subsequently removed.

Additional contact cavities can be formed through the at least one contact level dielectric layer (82, 190). The additional contact cavities overlie underlying conductive structures such as the backside contact via structure(s) 76, the gate contact via structure(s) 8G, the active region contact via structure(s) 8A, and the control gate contact via structures 8C. Each contact cavities may be formed as a via cavity that extends vertically through the at least one contact level dielectric layer (82, 190) only within an area that overlies a respective underlying conductive structure, or as a line cavity that laterally extends from an area that overlies a respective underlying conductive structure to another area that does not overlie an underlying conductive structure. Alternatively, each contact cavity can be formed as a dual damascene cavity including a via cavity at a lower portion thereof and including a line cavity at an upper portion thereof.

Drain contact via structures 88 can be formed in the drain contact via cavities in the device region 100 by depositing a conductive material in the drain contact via cavities and subsequently removing excess portions of the conductive material from above a horizontal plane including the top surface of the at least one contact level dielectric layer (82, 190).

Figure 8C:
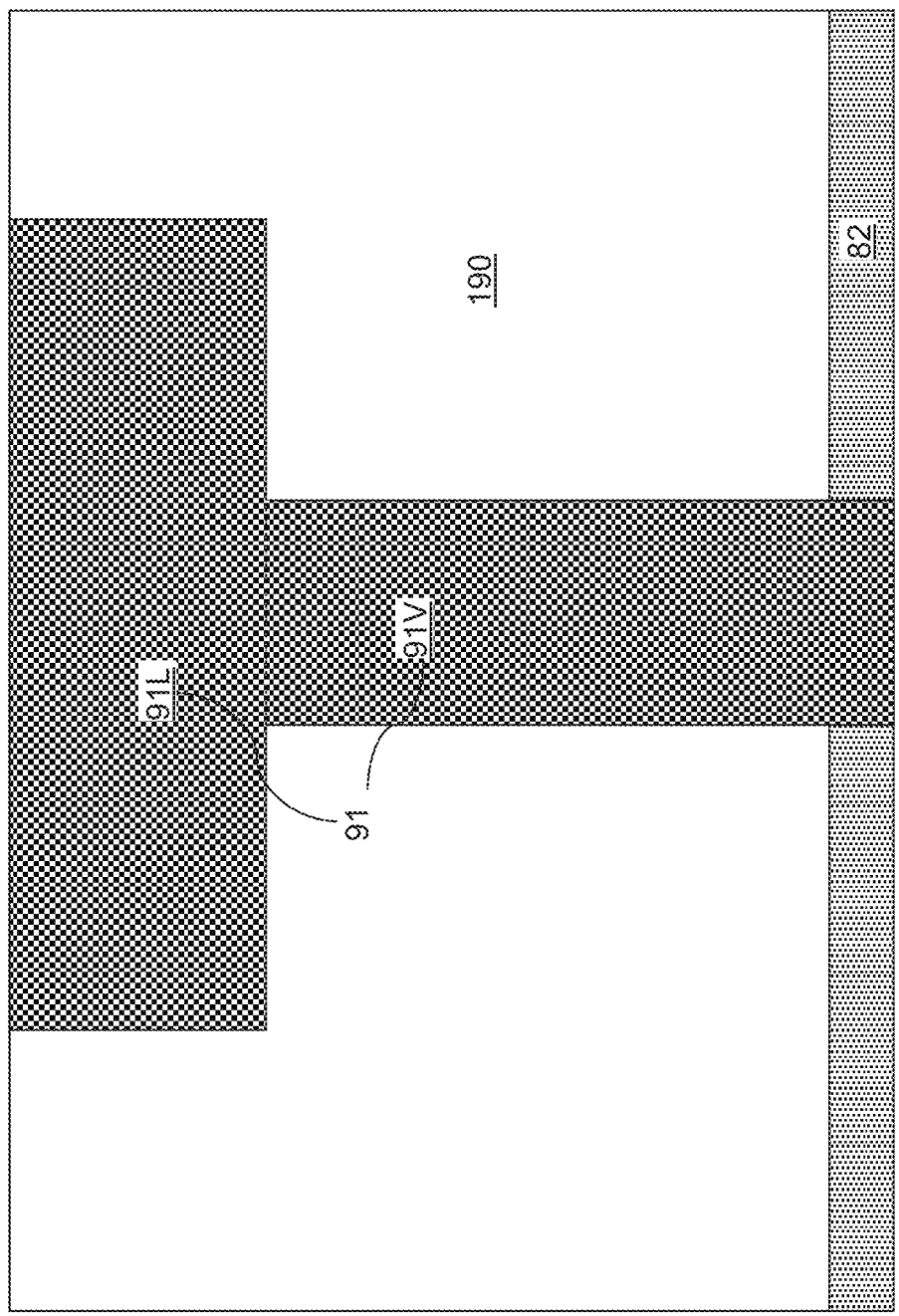
FIG. 8C is an illustration of an alternate embodiment of a contact level interconnect structure according to an embodiment of the present disclosure.
Figure 9A:
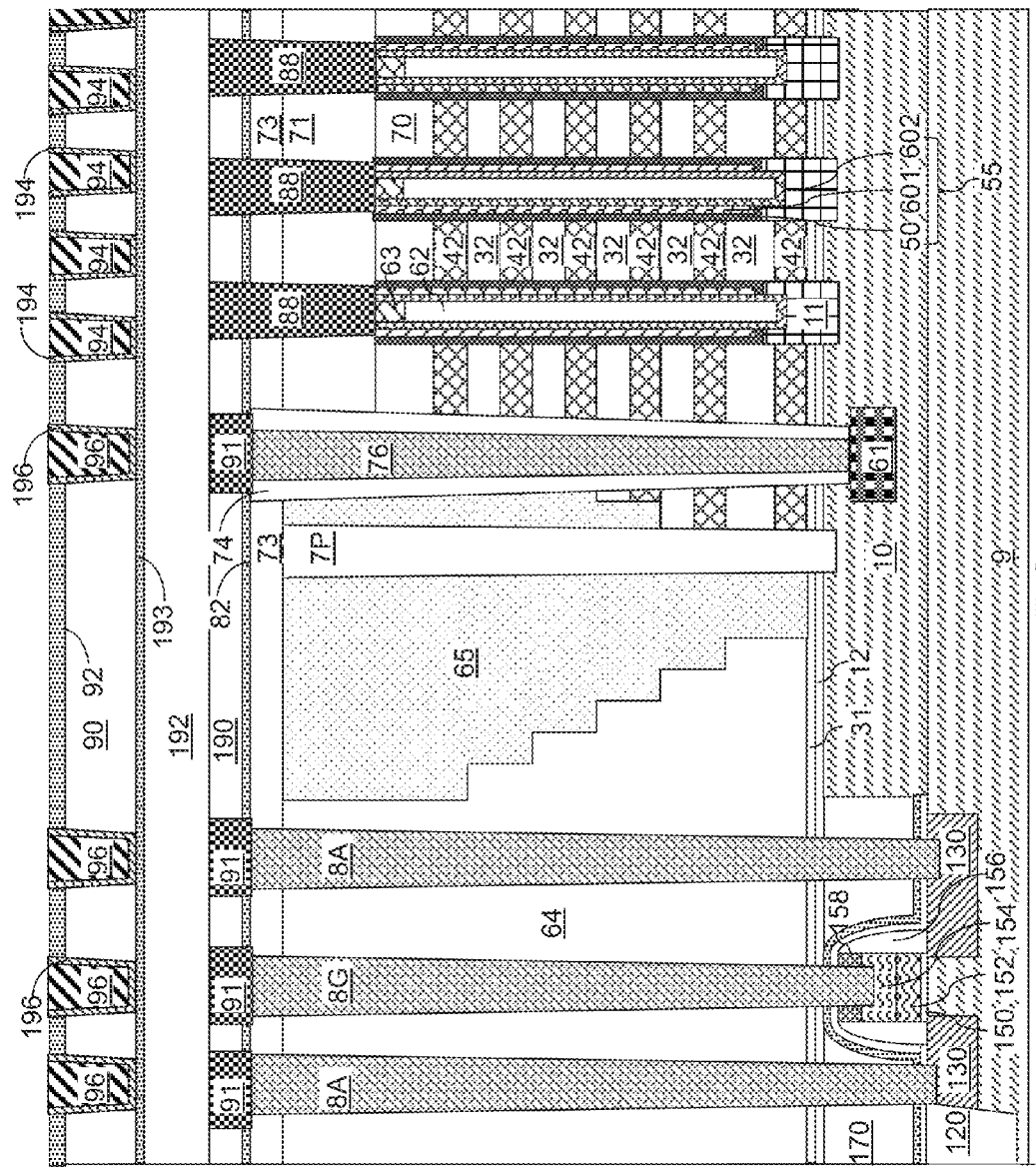
FIGS. 9A and 9B are vertical cross-sectional views of regions of the exemplary structure after formation of line structures according to an embodiment of the present disclosure.
Figure 9B:
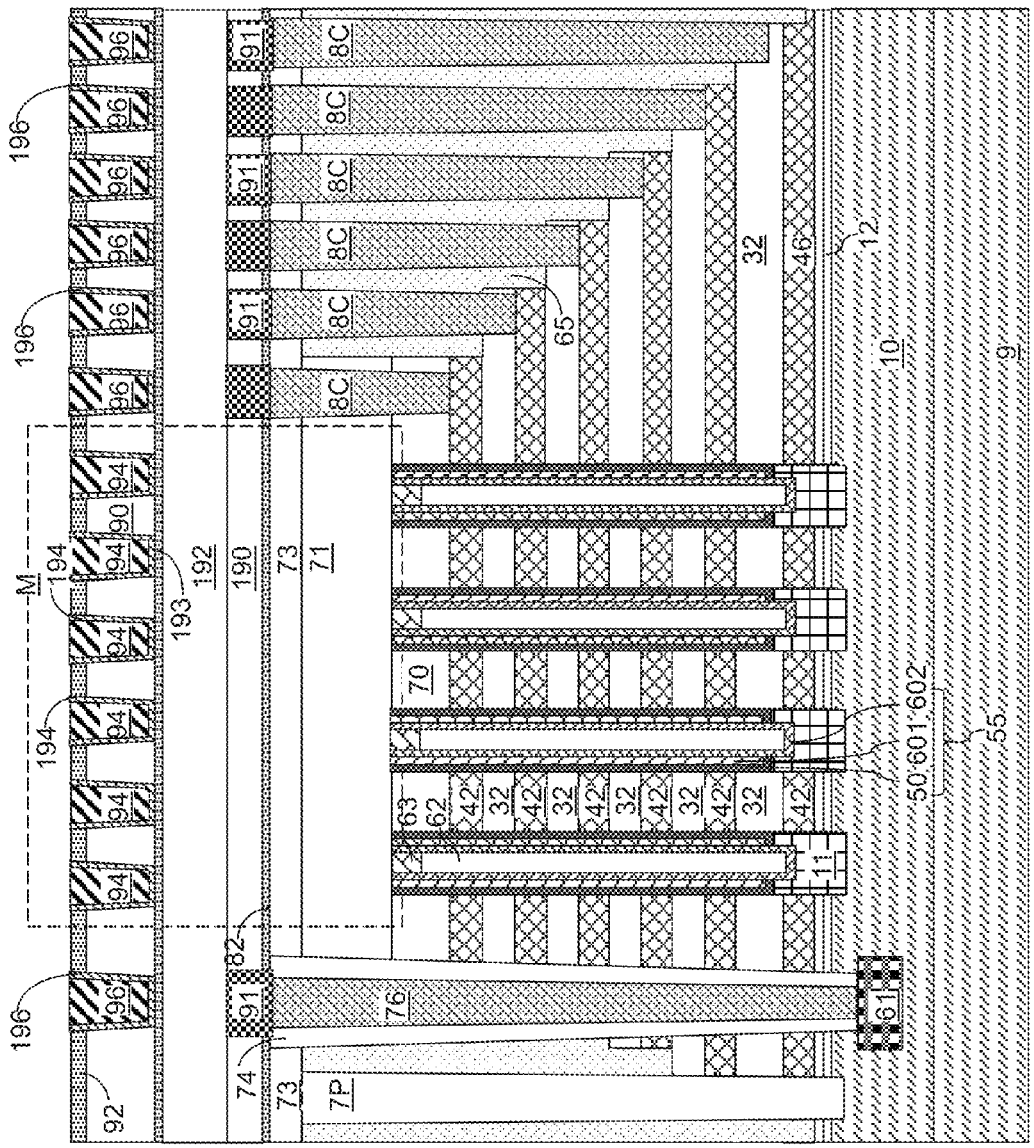

Various contact level interconnect structures 91 can be formed through the at least one contact level dielectric layer (82, 190) to provide electrical contact to various underlying contact via structures (76, 8A, 8G, 8C), which include the backside contact via structure 76, the active region contact via structures 8A, the gate contact via structures 8G, and the control gate contact via structures 8C. The contact level interconnect structures 91 can be formed simultaneously with formation of the drain contact via structures 88. In one embodiment, at least one of the contact level interconnect structures 91 can be a contact level via structure. Additionally or alternatively, at least one of the contact level interconnect structures 91 can be a contact level line structure. Additionally or alternatively, at least one of the contact level interconnect structures 91 can be an integrated line and via structure including a line portion 91L and a via portion 91V as illustrated in FIG. 8C.

At least one via level dielectric layer (192, 193) can be subsequently formed over the at least one contact level dielectric layer (82, 190). In one embodiment, the at least one via level dielectric layer (192, 193) can include a via level dielectric material layer 192 and a via level etch stop layer 193. The via level dielectric material layer 192 is a dielectric material layer, can include silicon oxide or organosilicate glass, and can have a thickness in a range from 10 nm to 300 nm. The via level etch stop layer 193 is an etch stop layer that is formed over the via level dielectric material layer 192, can include silicon nitride or nitrogen-doped organosilicate glass, and can have a thickness in a range from 1 nm to 30 nm. In one embodiment, the bottom surface of the at least one via level dielectric layer (192, 193) can be coplanar with the top surfaces of the various contact level interconnect structures 91.

Subsequently, at least one line level dielectric layer (90, 92) can be formed over the at least one via level dielectric layer (192, 193). The at least one line level dielectric layer (90, 92) can include a single dielectric material layer or can include a stack of multiple dielectric material layers. In one embodiment, the at least one line level dielectric layer (90, 92) can include a line level dielectric material layer 90 and an optional dielectric cap layer 92. The line level dielectric material layer 90 is a dielectric material layer, can include silicon oxide or organosilicate glass, and can have a thickness in a range from 10 nm to 300 nm. The dielectric cap layer 92 is a dielectric material layer that is formed over the line level dielectric material layer 90, can include silicon nitride or nitrogen-doped organosilicate glass, and can have a thickness in a range from 1 nm to 30 nm.

A first mask layer, such as a photoresist and/or hard mask layer 97 can be applied over the at least one line level dielectric layer (90, 92), for example, by spin coating. The first mask layer 97 is lithographically patterned with a line pattern. As used herein, a "line pattern" refers to any pattern including features that extend predominantly along one horizontal direction. A line pattern may include wiggles and/or bulges, or may include a set of parallel lines. The pattern in the first mask layer 97 is transferred through the at least one line level dielectric layer (90, 92) by at least one anisotropic etch. A line cavity (93, 95) is formed in each etched portion of the at least one line level dielectric layer (90, 92). In one embodiment, each line cavity (93, 95) does not extend into the at least one contact level dielectric layer (82, 190). In one embodiment, the line cavities (93, 95) can include bit line cavities 93 that are formed over the memory stack structures 55, and contact line cavities 95 that are formed over the various contact level interconnect structures 91. The first mask layer 97 can be subsequently removed, for example, by ashing.

Referring to FIGS. 9A, 9B, 10A, and 10B, line structures {(94, 194), (96, 196)} are formed in the line cavities (93, 95). Areas of the memory stack structures 55 are illustrated in dotted circles in FIG. 10B. The line structures {(94, 194), (96, 196)} can be formed by depositing at least one conductive material in the line cavities (93, 95), and removing excess portions of the deposited at least one conductive material from above a horizontal plane including the top surface of the at least one line level dielectric layer (90, 92). Removal of the excess portions of the deposited at least one conductive material can be performed, for example, by a recess etch and/or chemical mechanical planarization (CMP). The line structures {(94, 194), (96, 196)} can include bit line structures (94, 194) and contact line structures (96, 196). Each bit line structure (94, 194) can be formed in a respective bit line cavity 93, and each contact line structure (96, 196) can be formed in a respective contact line cavity 95.

In one embodiment, each line cavity (93, 95) can be filled with a combination of a conductive line liner material and a conductive line fill material. In this case, portions of the conductive line liner material and the conductive line fill material can be removed from above the topmost surface of the at least one line level dielectric layer (90, 92). In one embodiment, the removed portions of the conductive line liner material and the conductive line fill material can be removed by a first planarization process employing the dielectric cap layer 92 as a stopping layer.

Each remaining portion of the conductive line liner material constitutes a conductive line liner (194 or 196), and each remaining portion of the conductive line fill material constitutes a conductive line fill material portion (94 or 96). Each adjoining pair of a conductive line liner (194 or 196) and a conductive line fill material portion (94 or 96) collectively constitutes a line structure {(94, 194), (96, 196)}. The liner may be a conductive metallic nitride material such as TiN, TaN, WN, or a combination thereof, and the conductive via fill material can comprise an elemental metal or an intermetallic alloy such as Cu, W, Ag, Au, or an alloy or a combination thereof. The line structures {(94, 196)} include a bit line structure (94, 194) and a contact line structure (96, 196). Each bit line structure (94, 194) includes a bit line fill material portion 94 and a bit line liner 194. Each contact line structure (96, 196) includes a contact line fill material portion 96 and a contact line liner 196. Each contact line structure (96, 196) can contact a top surface of a contact via structures (76, 8G, 8A, 8C).

Figure 10A:
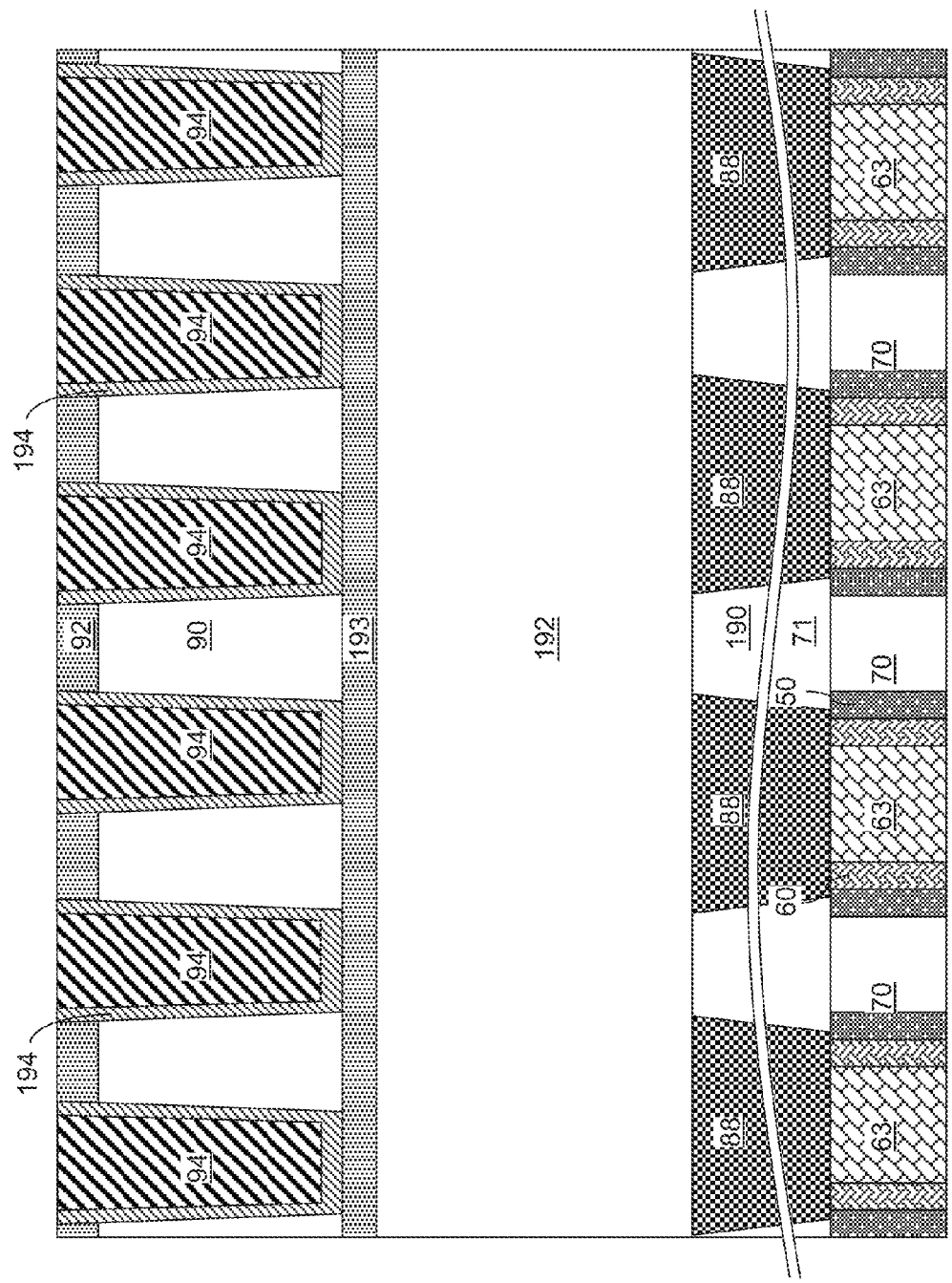
FIG. 10A is a vertical cross-sectional view of a magnified region M of FIG. 9B according to an embodiment of the present disclosure.
Figure 10B:
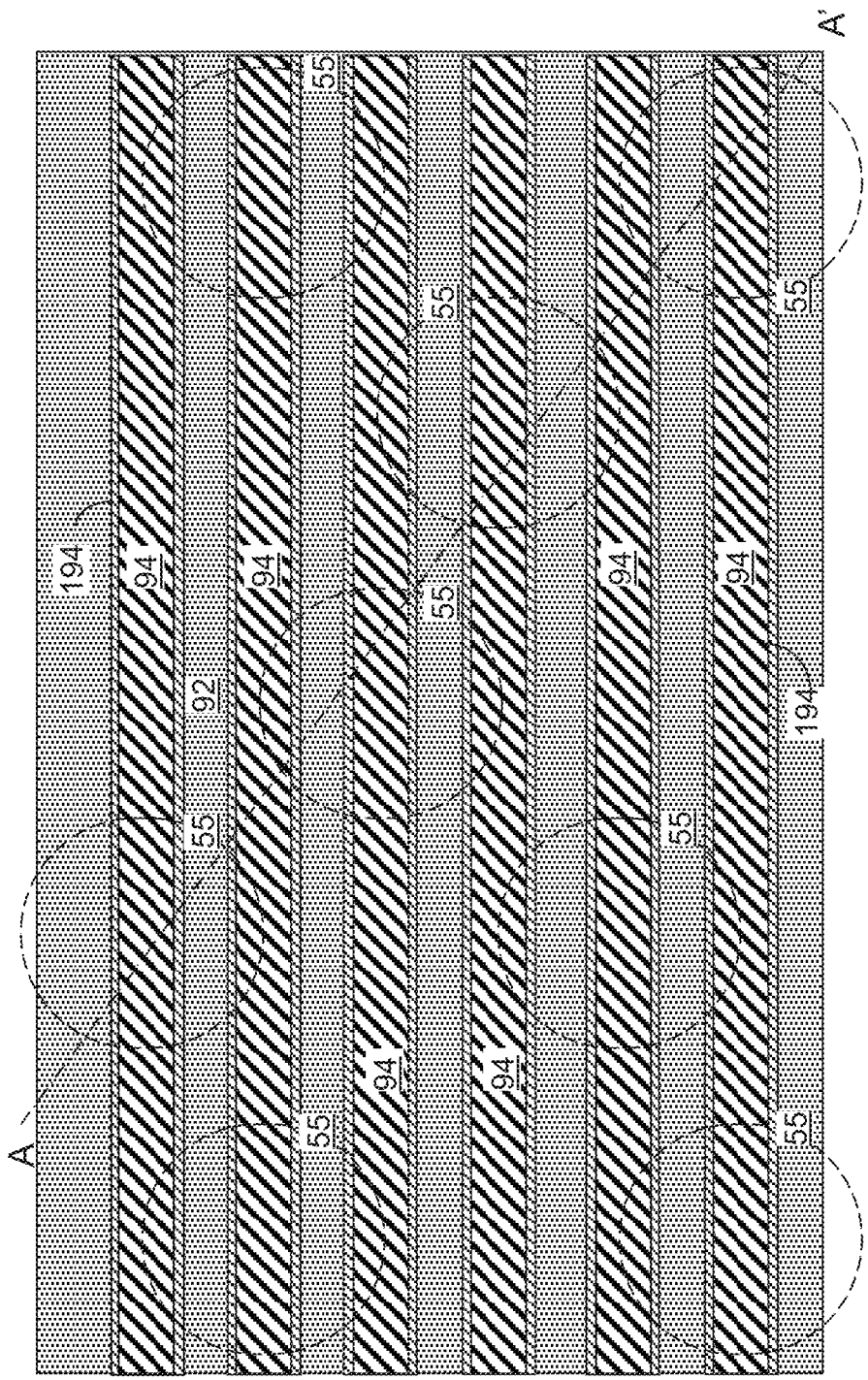
FIG. 10B is a top-down view of the magnified region M of FIG. 10A. The vertical plane A-A' is the plane of the vertical cross-sectional view of FIG. 10A.

It is understood that the arrangement of the memory stack structures 55 as illustrated in FIG. 10B is exemplary, and various variations and/or modifications can be employed for the arrangement of the memory stack structures 55. Further, it is understood that the bit line structure (94, 194) can have uniform width or undulating widths, and can be substantially straight or can have wiggles in horizontal cross-sectional shapes. The bit line structure can have substantially vertical sidewalls, or can have a non-zero taper angle (as measured from a vertical direction) in the width direction.

Figure 11A:
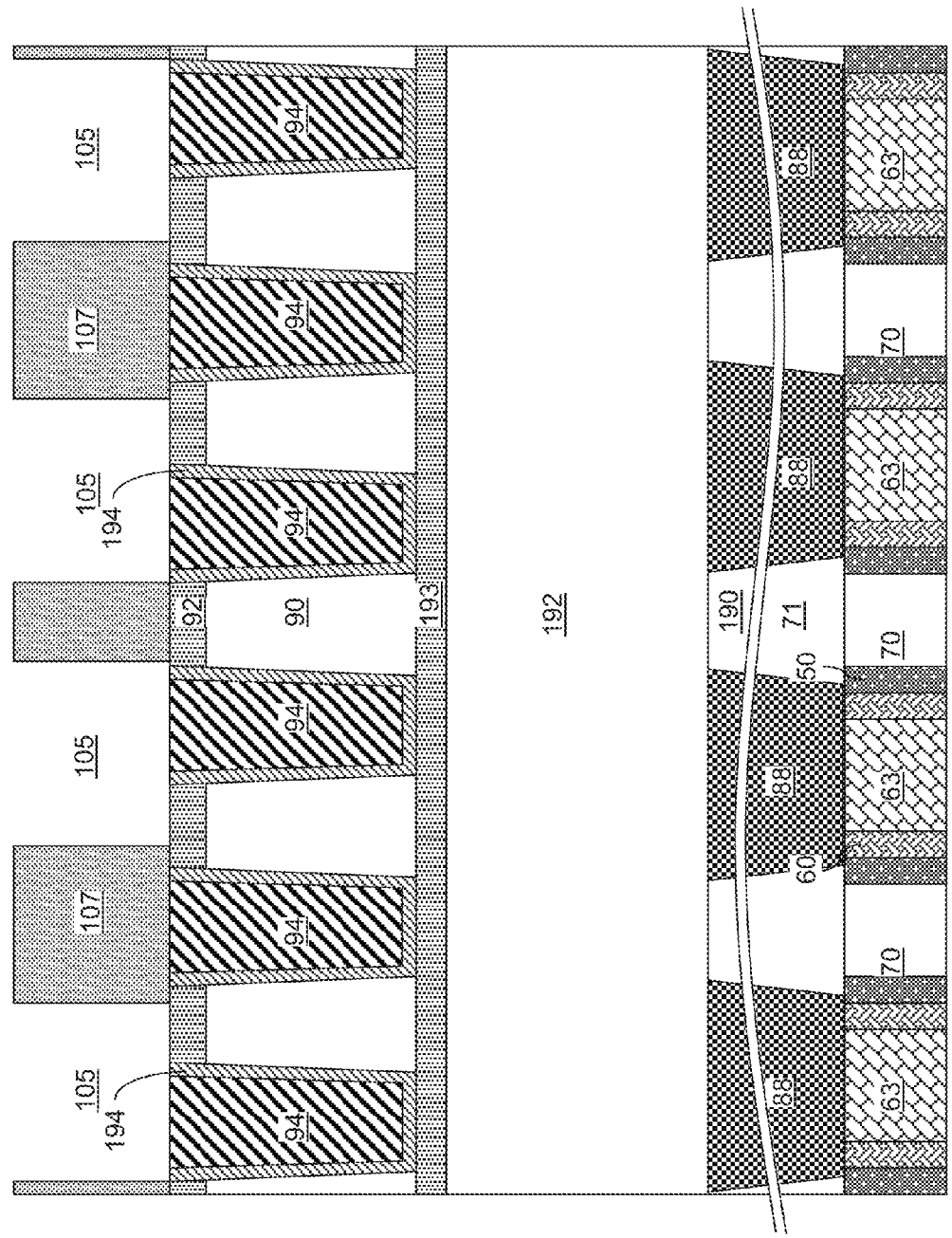
FIG. 11A is a vertical cross-sectional view of the magnified region M after application and patterning of a photoresist layer according to an embodiment of the present disclosure.
Figure 11B:
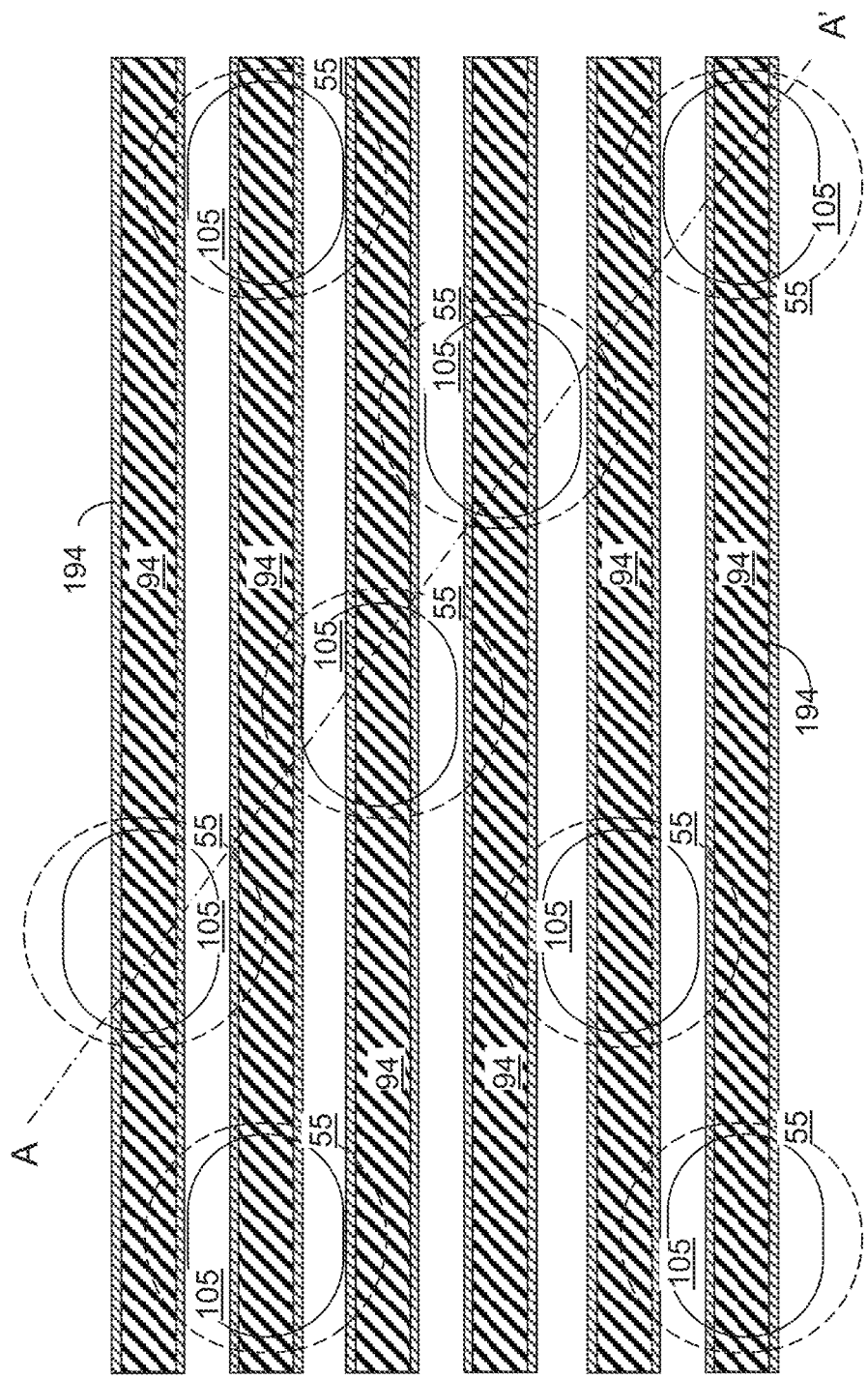
FIG. 11B is a see-through top-down view of the magnified region M of FIG. 11A, in which the patterned photoresist layer is not shown for clarity and areas of memory stack structures are illustrated. The vertical plane A-A' is the plane of the vertical cross-sectional view of FIG. 11A.

Referring to FIGS. 11A and 11B, a second mask layer 107, such as a photoresist and/or hardmask layer, can be applied and patterned over the at least one line level dielectric layer (90, 92) such that openings 105 are formed over the bit line structures (94, 194). The second mask layer 107 is shown in FIG. 11A, but is not shown in FIG. 11B for clarity. The openings 105 in the second mask layer 107 can overlie a portion of a bit line structure (94, 194). In one embodiment, two disjoined segments of a periphery of an opening 105 in the second mask layer 107 can straddle an underlying bit line structure (94, 194) so that a top surface of a portion of the underlying bit line structure (94, 194) having a full width of the underlying bit line structure (94, 194) is physically exposed within the opening 105.

In one embodiment, the area of an opening 105 can be less than, and can be located entirely within, the area of an underlying memory stack structure 55. In one embodiment, the shape of at least one opening 105 can be oval, elliptical, or can be of a curvilinear shape having a greater dimension along the lengthwise direction of an underlying bit line structure (94, 104) than along the widthwise direction of the underlying bit line structure (94, 104).

The patterned second mask layer 107 can have additional openings (not shown) that overlie the various contact level interconnect structures 91 in the contact region 300 and the peripheral region 200. The openings in the patterned second mask layer 107 in the contact region 300 and the peripheral region 200 can overlie portions of the contact line structures (96, 196).

Figure 12A:
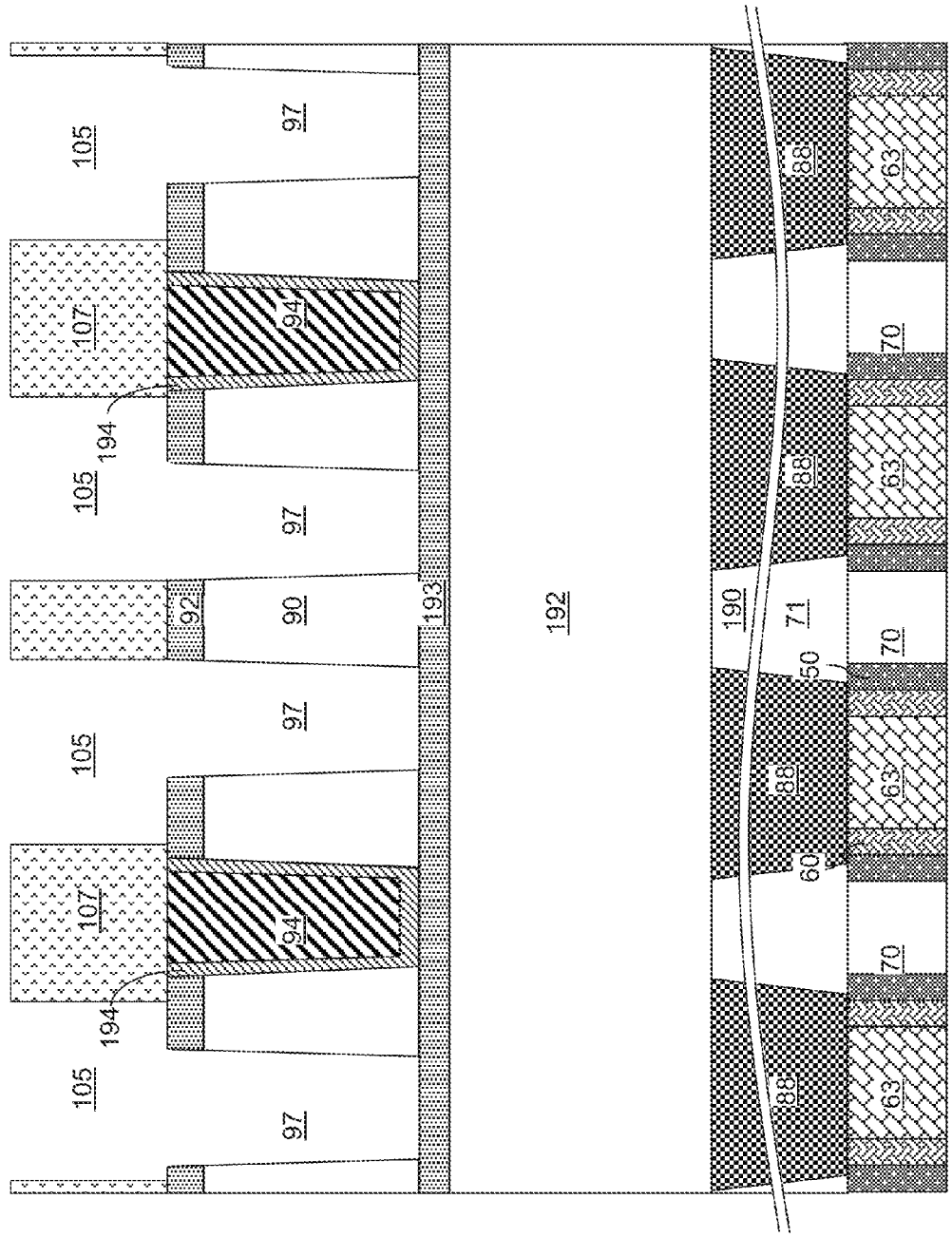
FIG. 12A is a vertical cross-sectional view of the magnified region M after a first step of an anisotropic etch process that removes physically exposed portions of the line structures from underneath openings in the patterned photoresist layer according to an embodiment of the present disclosure.
Figure 12B:
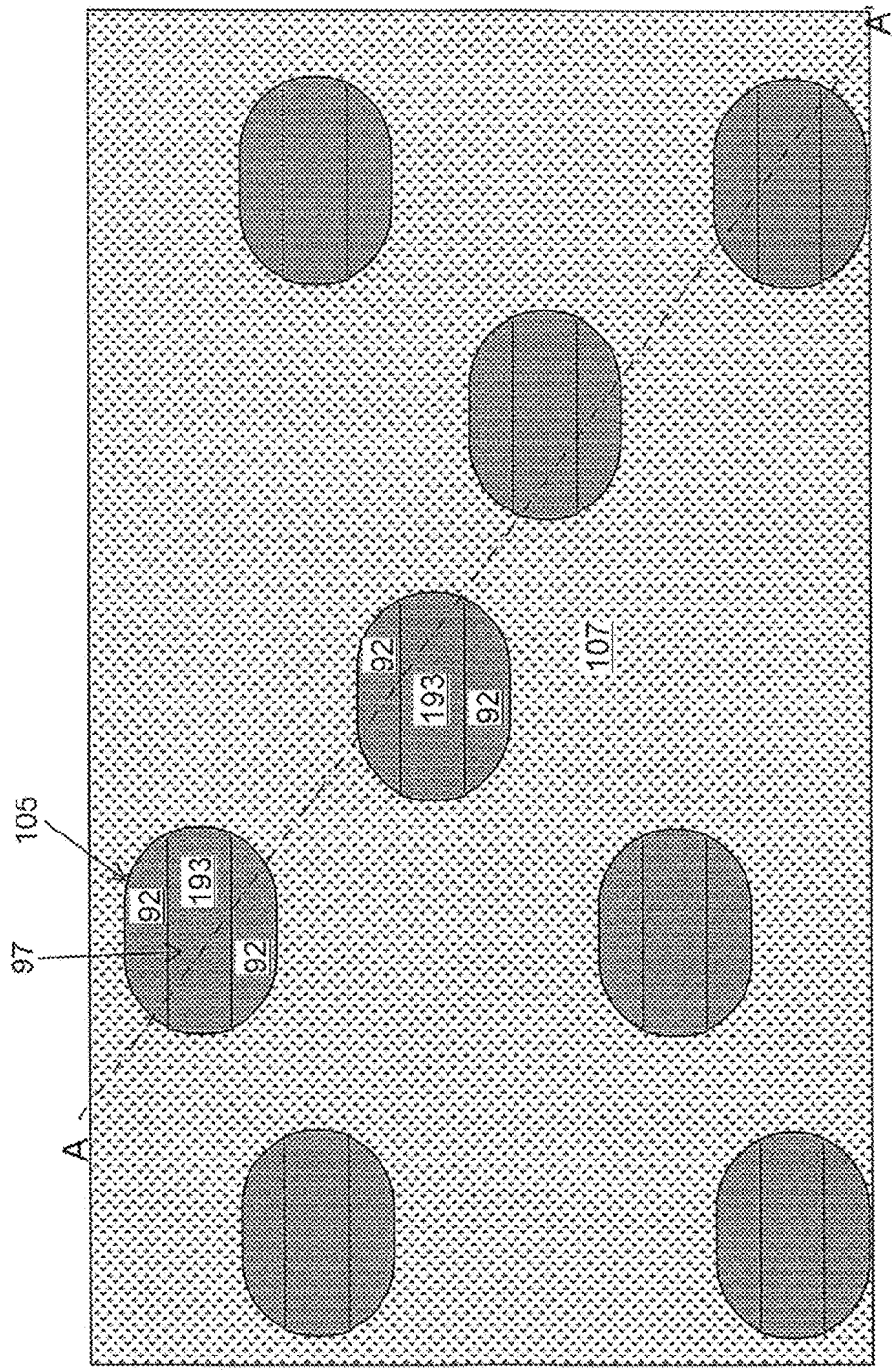
FIGS. 12B and 12C are top-down views of the magnified region M of FIG. 12A. The vertical plane A-A' is the plane of the vertical cross-sectional view of FIG. 12A.
Figure 12C:
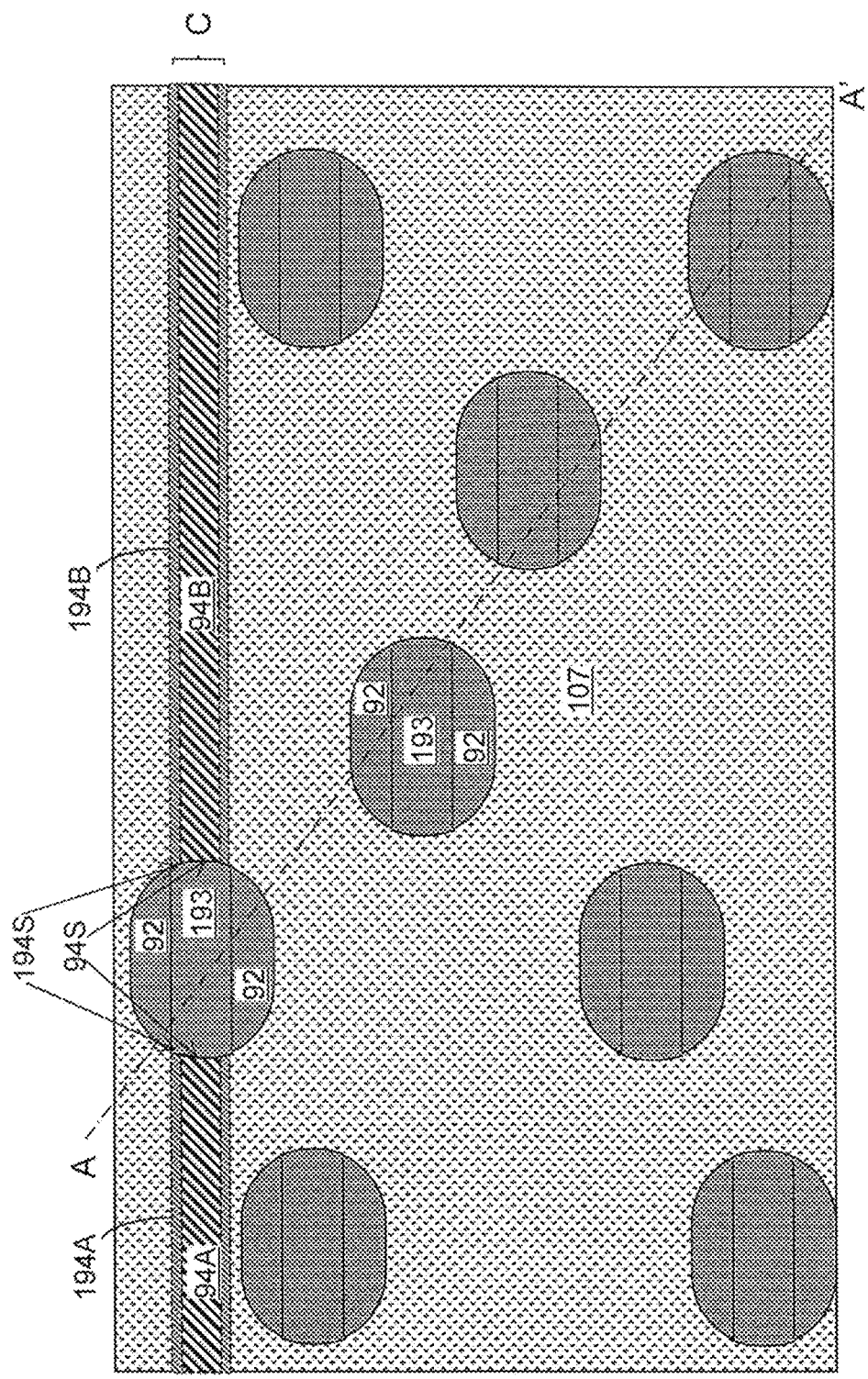

Referring to FIGS. 12A and 12B, a first anisotropic etch process can be performed to remove physically exposed portions of the bit line structures (94, 194) from underneath openings 105 in the patterned second mask layer 107 in the device region 100. The first anisotropic etch process removes the conductive materials of the portions of the bit line structures (94, 194) located within the areas of the openings 105 in the second mask layer 107 selective to the material of the topmost layer of the at least one line level dielectric layer (90, 92), which can be, for example, the dielectric cap layer 92. In one embodiment, the first anisotropic etch process removes metallic material of the bit line structures (94, 194) selective to the dielectric materials of the at least one line level dielectric layer (90, 92). Via cavities 97 can be formed through the at least one line level dielectric layer (90, 92) by etching portions of the bit line structures (94, 194) underlying the openings 105 in the second mask layer 107 employing a combination of the patterned second mask layer 107 and the at least one line level dielectric layer (90, 92) as an etch mask. Each via cavity 97 extends through remaining portions (94A/194A)

and (94B/194B) of the bit line structures (94, 194). FIG. 12C contains a cut-away view through mask layer 107 along one bit line structure in region C. In one embodiment, each via cavity 97 can have a substantially same width as a pair of remaining portions of a bit line structure (94, 194) through which the respective via cavity 97 extends. A disjoined pair of top surface portions of the at least one line level dielectric layer (90, 92) can be physically exposed within each opening 105 in the second mask layer 107.

Concurrently with formation of the via cavities 97 in the device region 100, the first anisotropic etch process can remove physically exposed portions of the contact line structures (96, 196) from underneath openings in the patterned second mask layer 107 in the contact region 300 and the peripheral device region 200, and to form additional via cavities.

After formation of the via cavities 97, the remaining portions (94A, 194A) and (94B, 194B) of each bit line structure (94, 194) can include a first line structure (94A, 194B) comprising a first line liner 194A and a first conductive line fill material portion 94A and located on one side of the via cavity 97, and a second line structure (94B, 194B) comprising a second line liner 194B and a second conductive line fill material portion 94B and located on the opposite side of the via cavity 97. In one embodiment, a sidewall 194S of each remaining portion of the conductive line liner 194 and a sidewall 94S of each remaining portion of the conductive line fill material portion 94 can be physically exposed in the via cavity 97.

Figure 13A:
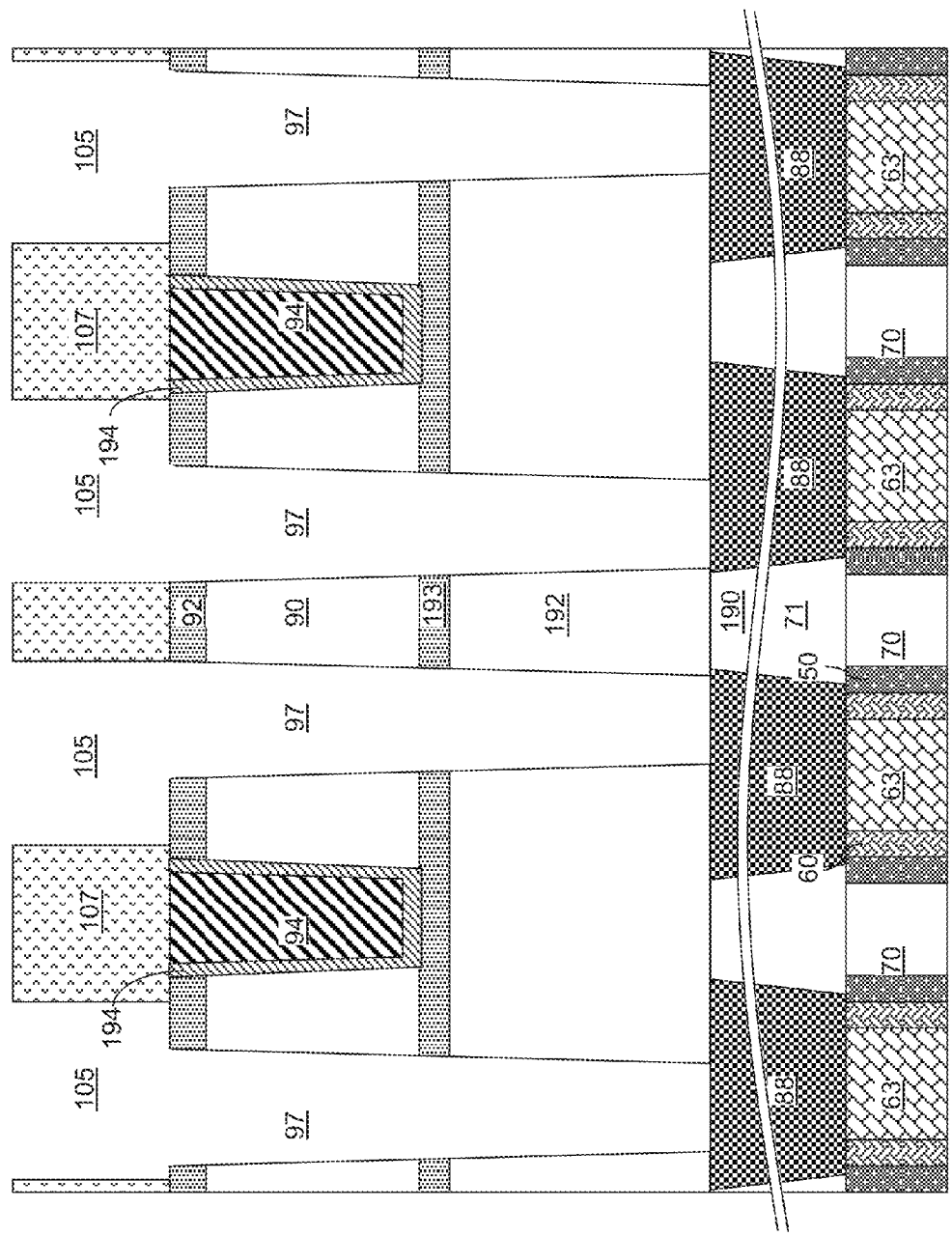
FIG. 13A is a vertical cross-sectional view of the magnified region M after a second step of an anisotropic etch process that removes physically exposed portions of at least one via level dielectric layer from underneath openings in the patterned photoresist layer according to an embodiment of the present disclosure.
Figure 13B:
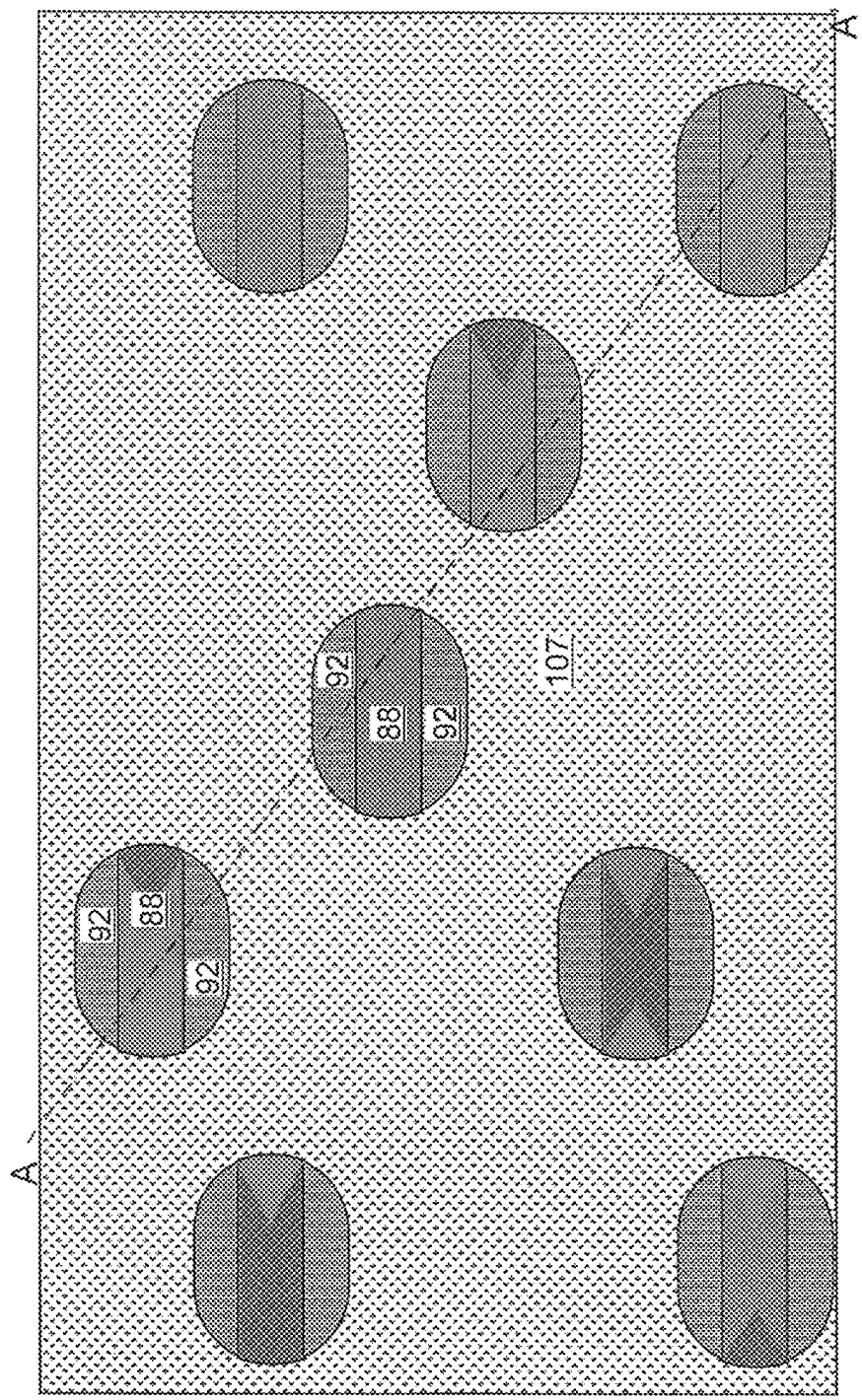
FIG. 13B is a top-down view of the magnified region M of FIG. 13A. The vertical plane A-A' is the plane of the vertical cross-sectional view of FIG. 13A.

Referring to FIGS. 13A and 13B, a second anisotropic etch process can be performed to vertically extend the via cavities 97 through the at least one via level dielectric layer (192, 193). The second anisotropic etch process removes the dielectric materials of the at least one via level dielectric layer (192, 193) located within the areas of the openings 105 in the second mask layer 107 selective to the material of the topmost layer of the at least one line level dielectric layer (90, 92), which can be, for example, the dielectric cap layer 92. The via cavities 97 can be vertically extended through the at least one via level dielectric layer (192, 193) by etching portions of the at least one via level dielectric layer (192, 193) underlying the openings 105 in the second mask layer 107 employing a combination of the patterned second mask layer 107 and the at least one line level dielectric layer (90, 92) as an etch mask. Each via cavity 97 extends through the bit line structures (94, 194) and the at least one via level dielectric layer (192, 193). In one embodiment, the via cavities 97 can have substantially vertical sidewalls, or can have a non-zero taper angle (as measured from a vertical direction). A top surface of a conductive element in a memory stack structure 55 can be physically exposed at the bottom of each via cavity 97. In one embodiment, a top surface of a drain region 63 can be physically exposed at the bottom of each via cavity 97. The additional via cavities in the contact region 300 and the peripheral device region 200 are vertically extended simultaneously by the etch process such that a top surface of an underlying contact level interconnect structures 91 can be physically exposed underneath each additional via cavity.

Thus, a portion of a bit line structure (94, 194) underlying an opening and a portion of the at least one at least one via level dielectric layer (192, 193) underlying the same opening can be etched employing anisotropic etch processes to form a via cavity 97. In one embodiment, each via cavity 97 extends through a pair of bit line structures (94, 194) (which can be remaining portions 94A/194A and 94B/194B of a same bit line structure (94, 194)), and the at least one line level dielectric layer (192, 193). The second mask layer 107 can be subsequently removed, for example, by ashing.

Figure 14A:
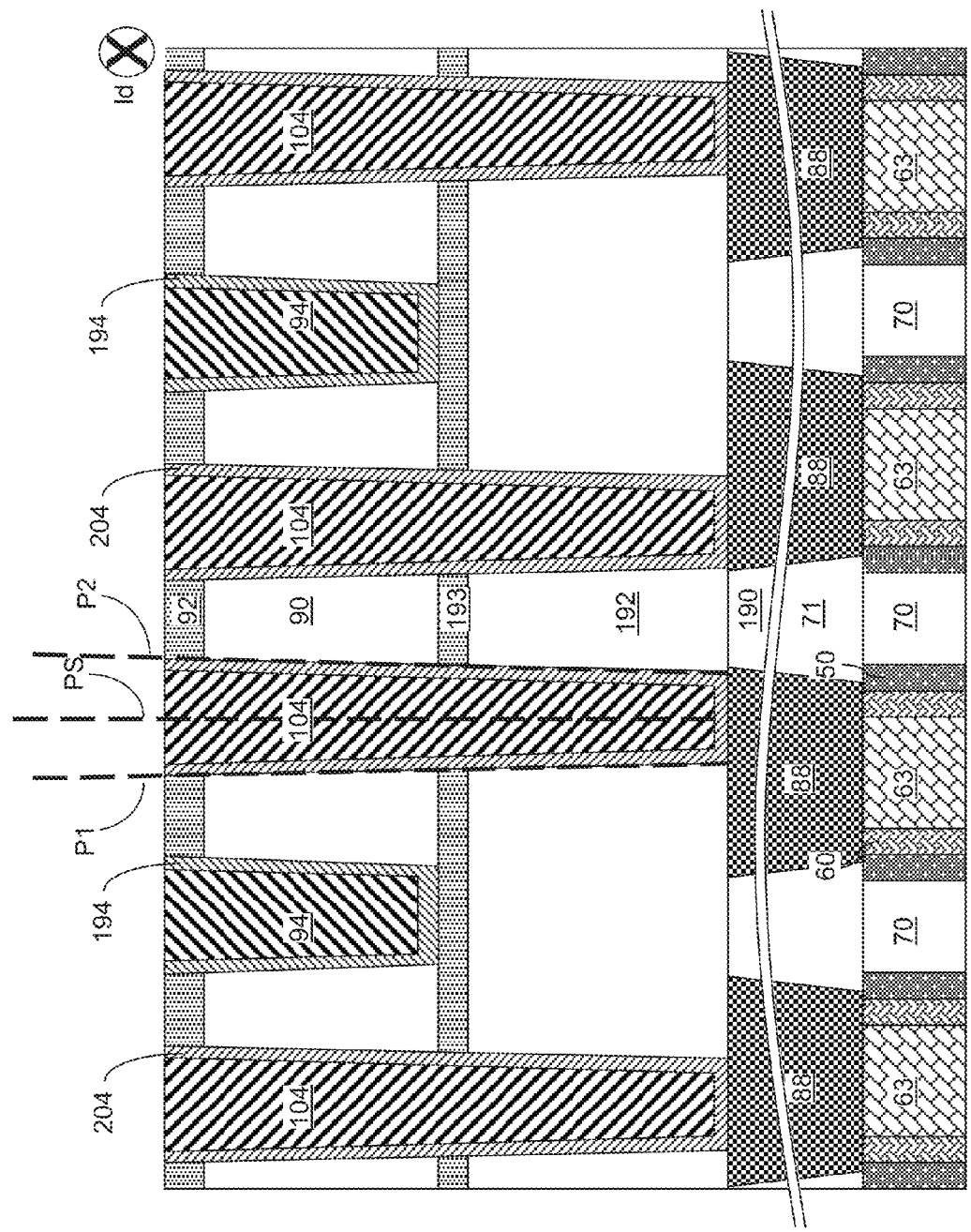
FIG. 14A is a vertical cross-sectional view of the magnified region M after formation of via structures according to an embodiment of the present disclosure.
Figure 14B:
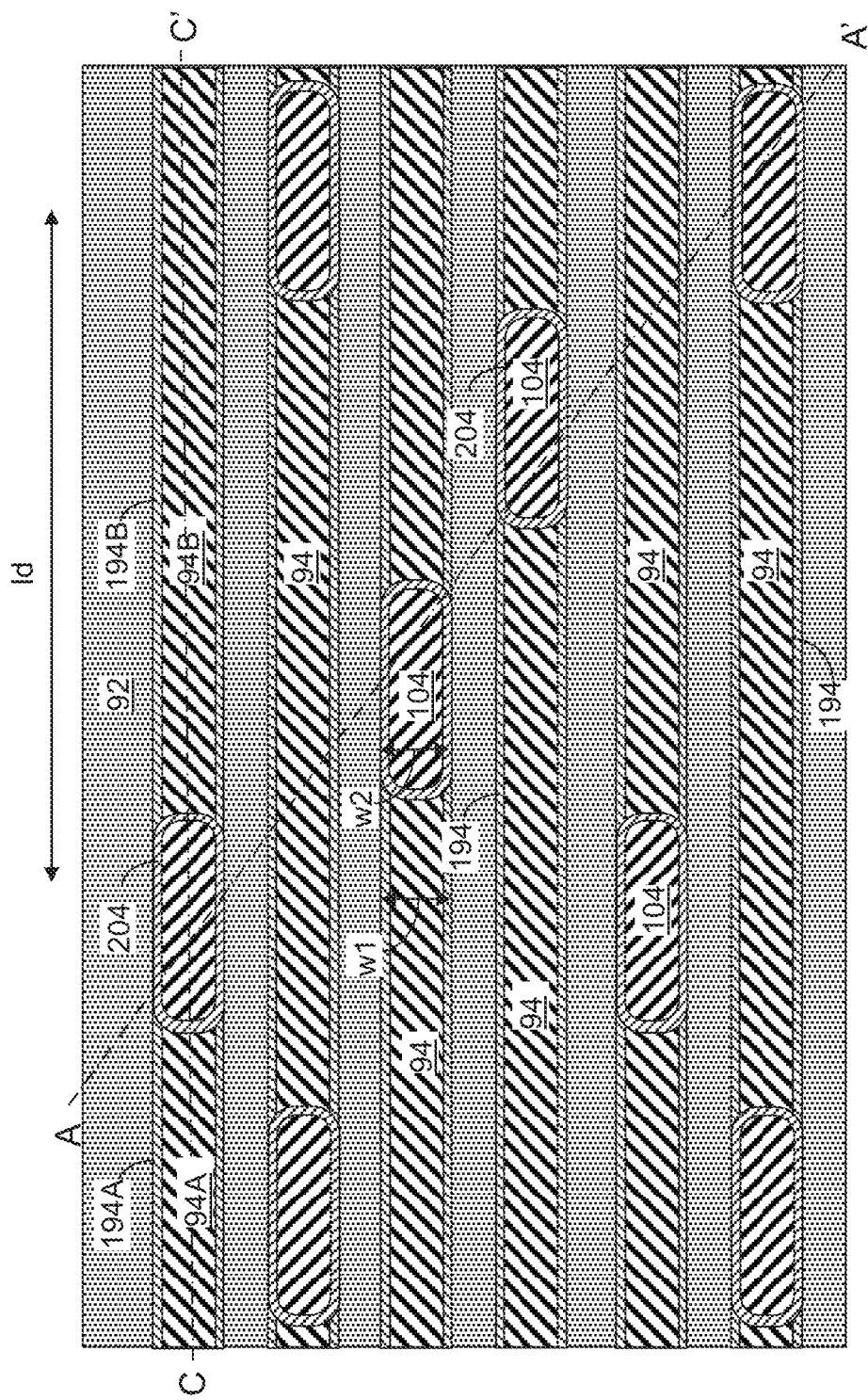
FIG. 14B is a top-down view of the magnified region M of FIG. 14A. The vertical plane A-A' is the plane of the vertical cross-sectional view of FIG. 14A. The vertical plane C-C' is the plane of the vertical cross-sectional view of FIG. 14C.
Figure 15A:
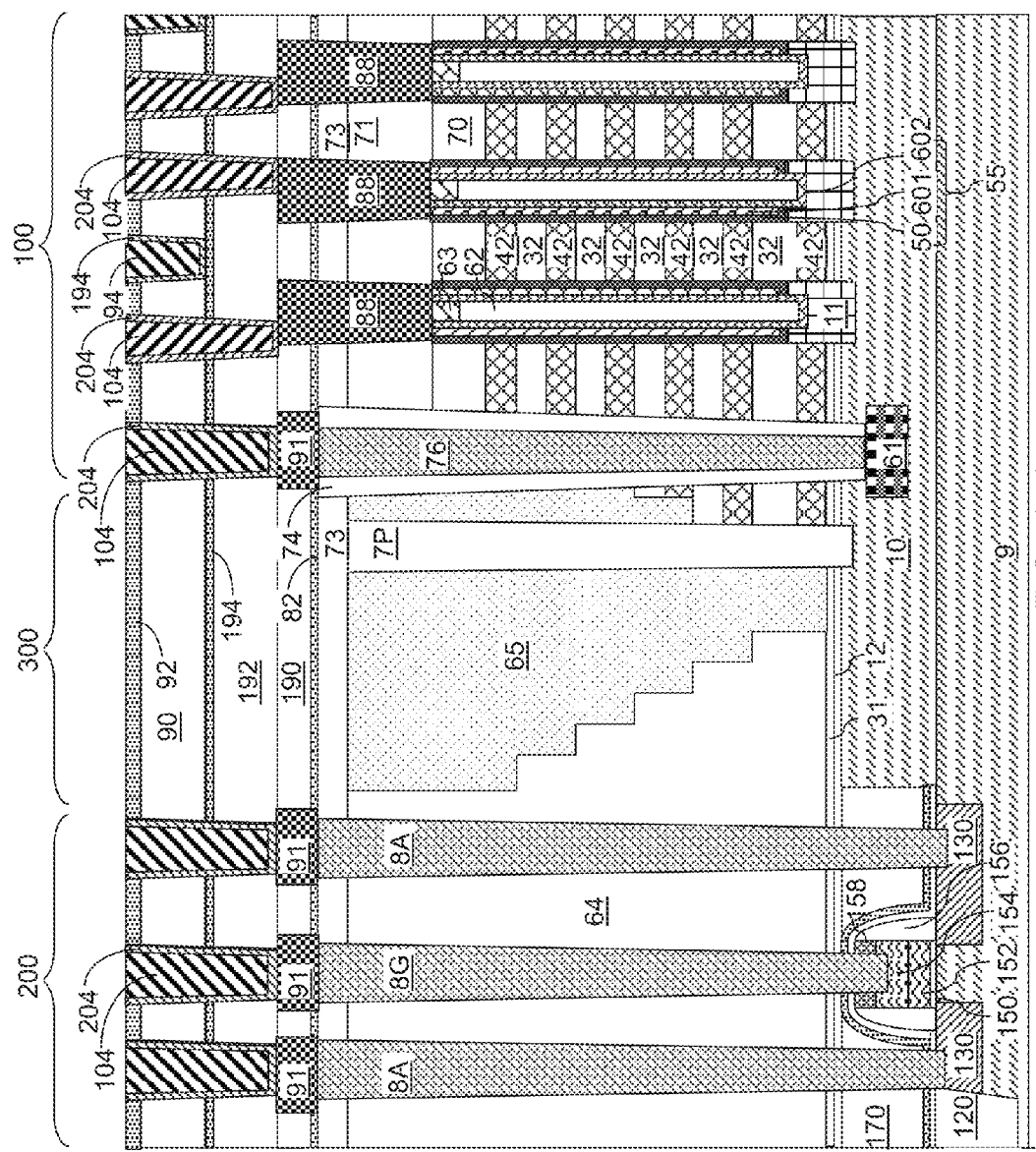
FIGS. 15A and 15B are vertical cross-sectional views of regions of the exemplary structure after formation of integrated line and via structures according to an embodiment of the present disclosure.
Figure 15B:
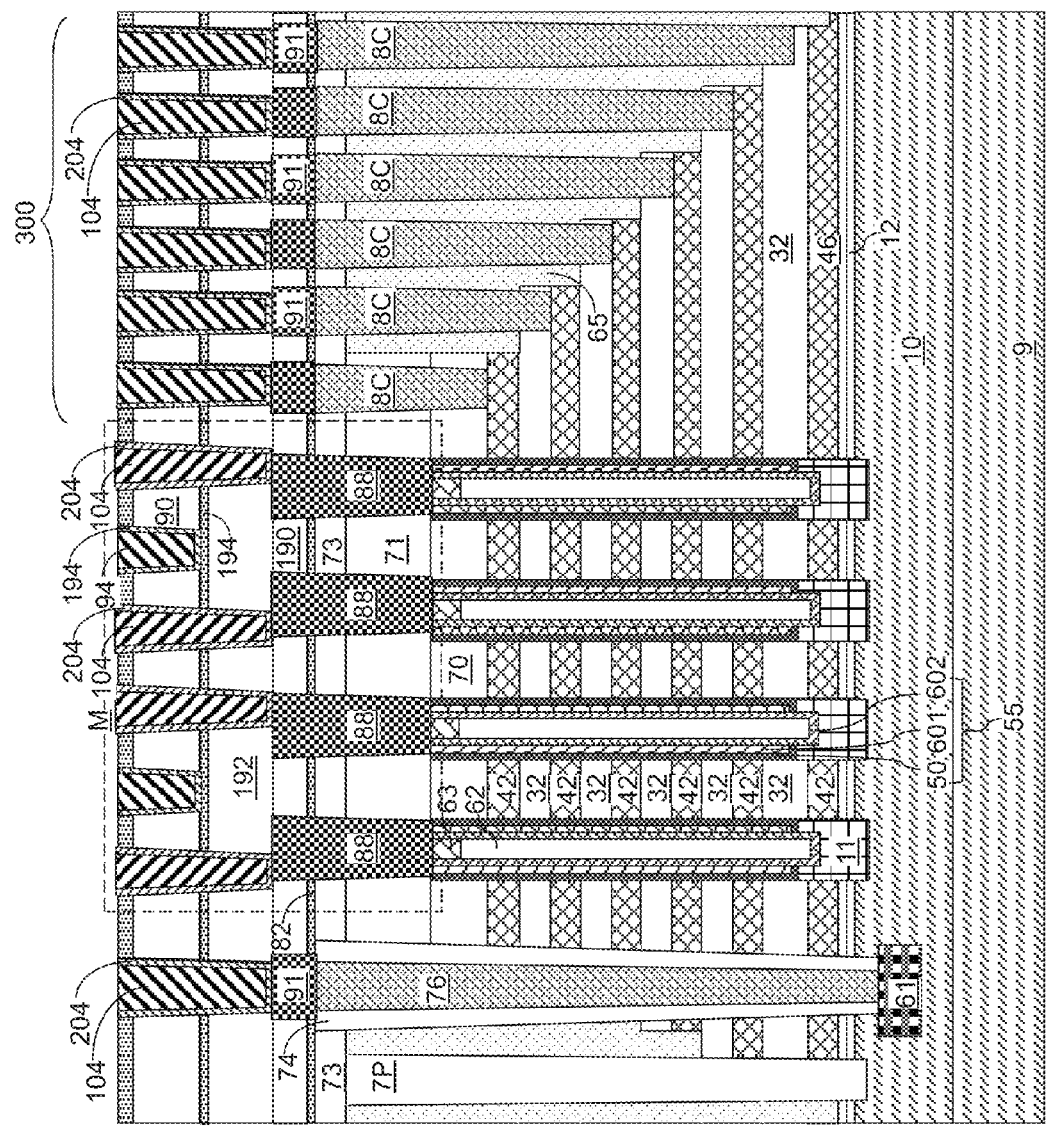

Referring to FIGS. 14A-14C, 15A, and 15B, a via structure (104, 204) can be formed in each via cavity 97. FIGS. 14A-14C illustrate a region of the exemplary structure after formation of the integrated line and via structures (94, 194, 104, 204). FIGS. 15A and 15B illustrate the exemplary structure after formation of the integrated line and via structures (94, 194, 104, 204). The via structures (104, 204) can be formed by depositing a conductive via liner material and a conductive via fill material in the via cavities 97. In one embodiment, the conductive via liner material can be a conductive metallic nitride material such as TiN, TaN, WN, or a combination thereof. In one embodiment, the conductive via fill material can comprise an elemental metal or an intermetallic alloy such as Cu, W, Ag, Au, or an alloy or a combination thereof.

Each via structure (104, 204) can be formed on a sidewall of a first line liner 194A (which is one of the bit line liners 194), a sidewall of a first bit line fill material portion 94A (which is one of the conductive line fill material portions (94, 96)), a sidewall of a second line liner 194B (which is one of the bit line liners 194), and a sidewall of the second bit line fill material portion 94B (which is another of the conductive line fill material portions (94, 96)). The conductive via liner material can be deposited on the sidewall 194S of the first line liner 194A, the sidewall 94S of the first conductive line fill material portion 94A, the sidewall of the second line liner 194B, and the sidewall of the second conductive line fill material portion 94B. The conductive via fill material can be deposited on the conductive via liner material.

Subsequently, portions of the conductive via liner material and the conductive via fill material can be removed from above the top surface of the at least one line level dielectric layer (90, 92), for example, by a recess etch, chemical mechanical planarization (CMP), or a combination thereof. In one embodiment, the removed portions of the conductive via liner material and the conductive via fill material can be removed by a second planarization process employing the dielectric cap layer 92 as a stopping layer. Each remaining portion of the conductive via liner material constitutes a conductive via liner 204, and each remaining portion of the conductive via fill material constitutes a conductive via fill material portion 104. Each adjoining pair of a conductive via liner 204 and a conductive via fill material portion 104 collectively constitutes a via structure (104, 204).

Integrated line and via structures (94, 194, 104, 204) can be formed, each of which comprises remaining portions of a bit line structure (94, 194) and at least one via structure (104, 204). Each integrated line and via structure (94, 194, 104, 204) can be formed within the stack of the at least one via level dielectric layer (192, 193) and the at least one line level dielectric layer (90, 92).

The exemplary structure comprises at least one at least one via level dielectric layer (192, 193) overlying a substrate (9, 10), at least one line level dielectric layer (90, 92) located above the at least one at least one via level dielectric layer (192, 193), and at least one integrated line and via structure (94, 194, 104, 204) comprising a first line structure (94A, 194A; See FIG. 14C) and a via structure (104, 204) in contact with each other. The first line structure (94A, 194A) contacts sidewalls of the at least one line level dielectric layer (90, 92) and a top surface of the at least one via level dielectric layer (192, 193). The via structure (104, 204) comprises a conductive via liner 104 contacting a sidewall of the at least one via level dielectric layer (192, 193), sidewalls of the at least one line level dielectric layer (90, 92) that extend along the lengthwise direction of the first line structure (94A, 194A), a sidewall of the first line structure (94A, 194A) and a sidewall of a second line structure (94B, 194B). The via structure (104, 204) further comprises a conductive via fill material portion 204 embedded within the conductive via liner 104. The second line structure (94B, 194B) can contact the conductive via liner 104 and additional sidewalls of the at least one line level dielectric layer (90, 92).

In one embodiment, the conductive via fill material portion 204 can be laterally spaced from each of the at least one via level dielectric layer (192, 193), the at least one line level dielectric layer (90, 92), and the first line structure (94A, 194A) and the second line structure (94B, 194B) by the conductive via liner 104. In one embodiment, a top surface of the conductive via liner 104 can be coplanar with a top surface of the first line structure (94A, 194A) and a top surface of the second line structure (94B, 194B).

In one embodiment, the first line structure (94A, 194A) and the second line structure (94B, 194B) laterally extend along a common lengthwise direction ld (such as the horizontal direction within the vertical plane C-C' illustrated in FIG. 14B or the direction perpendicular to the plane of the cross-sectional view of FIG. 14A). The first line structure (94A, 194A) and the second line structure (94B, 194B) can have a same vertical cross-sectional shape within vertical planes that are perpendicular to the common lengthwise direction ld, e.g., vertical planes that are perpendicular to the vertical plane C-C' illustrated in FIG. 14B. In one embodiment, the same vertical cross-sectional shape can be a shape of a symmetric trapezoid, and can be invariant under translation along the common lengthwise direction ld. In one embodiment, a pair of sidewalls of the first line structure (94A, 194A) and a pair of sidewalls of the second line structure (94B, 194B) can be located within a pair of planes (P1, P2) including the common lengthwise direction ld as a horizontal direction. For example, a first plane P1 can include a first sidewall of a via structure (104, 204), a first sidewall of the first line structure (94A, 194A) adjoined to the via structure (104, 204), and a first sidewall of the second line structure (94B, 194B) adjoined to the via structure (104, 204). A second plane P2 can include a second sidewall of the via structure (104, 204), a second sidewall of the first line structure (94A, 194A) adjoined to the via structure (104, 204), and a second sidewall of the second line structure (94B, 194B) adjoined to the via structure (104, 204). A plane of symmetry PS can be located between the first plane P1 and the second plane P2 such that the first and second planes (P1, P2) are symmetric with respect to the plane of symmetry PS.

The first line structure (94A, 194A) can comprise a first conductive line liner 194A contacting the sidewalls of the at least one line level dielectric layer (90, 92), and a first conductive line fill material portion 94A embedded in the first conductive line liner 194A. The second line structure (94B, 194B) can comprise a second conductive line liner 194B contacting the sidewalls of the at least one line level dielectric layer (90, 92), and a second conductive line fill material portion 94B embedded in the second conductive line liner 194B. In one embodiment, the conductive via liner 204 contacts a sidewall of the first conductive line fill material portion 94A and a sidewall of the second conductive line fill material portion 94B.

In one embodiment, an end surface (e.g., sidewall 194S) of the first conductive line liner 194A contacts an outer sidewall of the conductive via liner 204, and an end surface of the second conductive line liner 194B contacts another sidewall of the conductive via liner 204. In one embodiment, an upper periphery of the contact area between the end surface of the first conductive line liner 194A and the outer sidewall of the conductive via liner 204 can be coplanar with the top surface of the at least one line level dielectric layer (90, 92), and an upper periphery of the contact area between the end surface of the second conductive line liner 194B and the outer sidewall of the conductive via liner 204 can be coplanar with the top surface of the at least one line level dielectric layer (90, 92). In one embodiment, a lower periphery of the contact area between the end surface of the first conductive line liner 194A and the outer sidewall of the conductive via liner 204 can be coplanar with the bottom surface of the first line structure (94A, 194A), and a lower periphery of the contact area between the end surface of the second conductive line liner 194B and the outer sidewall of the conductive via liner 204 can be coplanar with the bottom surface of the second line structure (94B, 194B).

In one embodiment, an inner sidewall of the conductive via liner 204 can contact the conductive via fill material portion 104 and outer sidewalls of the conductive via liner 204 can contact the first and second conductive line fill material portions (94A, 94B). In one embodiment, the top surface of the conducive via liner 204 can be coplanar with the top surfaces of the first and second conductive line liners (194A, 194B), and the bottom surface of the conductive via liner 204 can be located below the horizontal plane including the bottom surfaces of the first and second conductive line liners (194A, 194B). The conductive via liner 204 and the first and second conductive line liners (194A, 194B) can have the same composition or different compositions, and can have the same thickness or different thicknesses.

In one embodiment, the first and second line structures (94A, 194A, 94B, 194B) can extend along the same lengthwise direction ld, and the top surface of the via structure (104, 204) can have the same width as a top surface of the first line structure (94A, 194A) and as a top surface of the second line structure (94B, 194B). For example, the top surface of the first line structure (94A, 194A) and the top surface of the second line structure (94B, 194B) can have a first width w1, and the top surface of the via structure (104, 204) can have a second width w2 that is the same as the first width w1.

In one embodiment, the at least one line level dielectric layer (90, 92) can comprise a dielectric cap layer 92 having a top surface that is coplanar with the top surface of the integrated line and via structure (94A, 194A, 94B, 194B, 104, 204), and a line level dielectric material layer 90 underlying the dielectric cap layer 92 and having a different composition than the dielectric cap layer 92. In one embodiment, the bottom surface of the first line structure (94A, 194A) can be located at the plane including a topmost surface of the via level dielectric layer 190.

While the present disclosure is described employing an embodiment in which the at least one via level dielectric layer (192, 193) and the at least one line level dielectric layer (90, 92) are formed at different processing steps as distinct layers, embodiments are expressly contemplated herein in which the at least one via level dielectric layer and the at least one line level dielectric layer are formed at a same processing step. The processing step deposits a dielectric material layer, and the at least one via level dielectric layer is a lower portion of the dielectric material layer and the at least one line level dielectric layer is an upper portion of the dielectric material layer.

In one embodiment, the via structure (104, 204) can be embedded between edge sidewalls 94S, 194S of the first and the second line structures (94A, 194A, 94B, 194B) to electrically connect the first and the second line structures (94A, 194A, 94B, 194B) together to form a bit line. Bottom surfaces of the first and the second line structures (94A, 194A, 94B, 194B) can be located above the bottom surface of the via structure (104, 204). The bottom surface of the via structure (104, 204) can physically contact an underlying device. The bottom surfaces of the first and the second line structures (94A, 194A, 94B, 194B) do not physically contact the underlying device. In one embodiment, a semiconductor channel 60 having at least a first channel portion can extend substantially perpendicular to a top surface of the substrate (9, 10), and the underlying device can comprise a doped semiconductor region (such as a drain region 63) in contact with an upper part of the first channel portion and in electrical contact with the via structure (104, 204). In one embodiment, the bottom surface of the via structure (104, 204) can physically contact a drain region of a NAND string which comprises a part of a monolithic three-dimensional NAND memory structure, and the bottom surfaces of the first and the second line structures (94A, 194A, 94B, 194B) do not physically contact the drain region 63 of the NAND string.

As shown in FIGS. 15A and 15B, subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (60L, 60T). At least one end portion of each of the plurality of semiconductor channels (60L, 60T) extends substantially perpendicular to a top surface of the semiconductor substrate. The device region 100 further includes a plurality of charge storage regions located within each memory layer 50. Each charge storage region is located adjacent to a respective one of the plurality of semiconductor channels (60L, 60T). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (60L, 60T) and at least one charge storage region located adjacent to the semiconductor channel (60L, 60T). At least one end portion of the semiconductor channel (60L, 60T) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region 61. The source region 61 can be in contact with the horizontal portion of the semiconductor channel in an upper portion of the semiconductor material layer 10.

A drain line, as embodied as a conductive line structure that contacts a drain contact via structure 88, electrically contacts an upper portion of the semiconductor channel (60L, 60T). As used herein, a first element "electrically contacts" a second element if the first element is electrically shorted to the second element. An array of drain regions 63 contacts a respective semiconductor channel (60L, 60T) within the array of memory stack structures 55. A top surface of the dielectric material layer, i.e., the insulating cap layer 70, can be coplanar with top surfaces of the drain regions 63.

Figure 16:
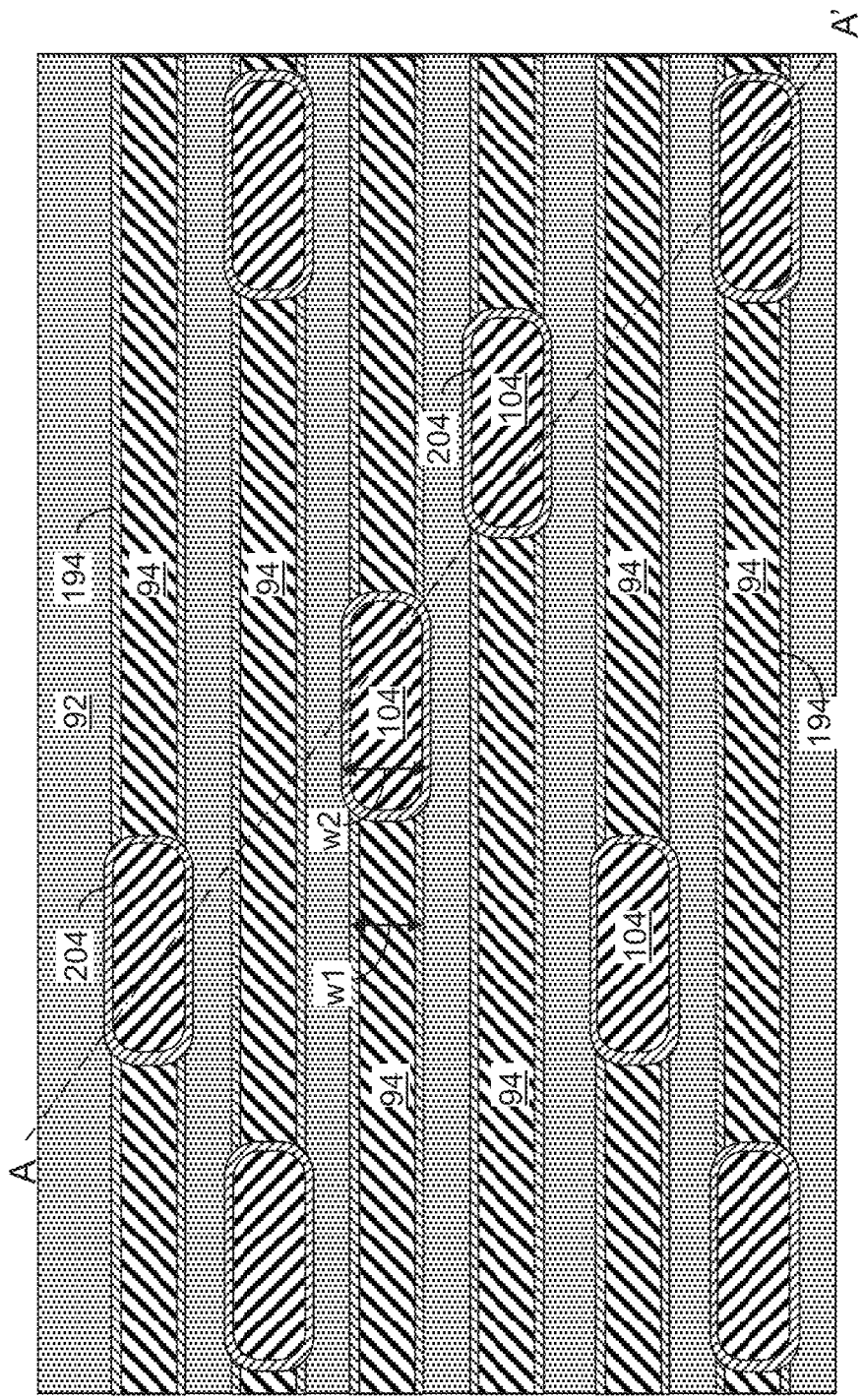
FIG. 16 is a top-down view of a magnified region M of a variation of the exemplary structure after formation of integrated line and via structures according to an embodiment of the present disclosure.

Referring to FIG. 16, a magnified region M of a variation of the exemplary structure is shown after formation of integrated line and via structures. In this case, the via cavities 97 can be laterally expanded intentionally by an isotropic etch to increase the lateral dimensions of via structures (104, 204) to be subsequently formed, or can be unintentionally expanded due to a collateral etch that occurs during the first or second anisotropic etch processes that form the via cavities 97 during the processing steps of 12A, 12B, 13A, and 13B. In this case, the via structures (104, 204) can be wider than adjoining line structures (94, 194).

In one embodiment, the first and second line structures (94A, 194A, 94B, 194B) can extend along the same lengthwise direction ld, the top surface of the first line structure (94A, 194A) and the top surface of the second line structure can have a same width that is less than the width of the top surface of the via structure (104, 204). For example, the top surface of the first line structure (94A, 194A) and the top surface of the second line structure can have a first width w1, and the top surface of the via structure (104, 204) can have a second width w2 that is greater than the first width w1. In this case, the via structure (104, 204) can laterally protrude symmetrically with respect to the first and second line structures (94A, 194A, 94B, 194B).

Figure 17:
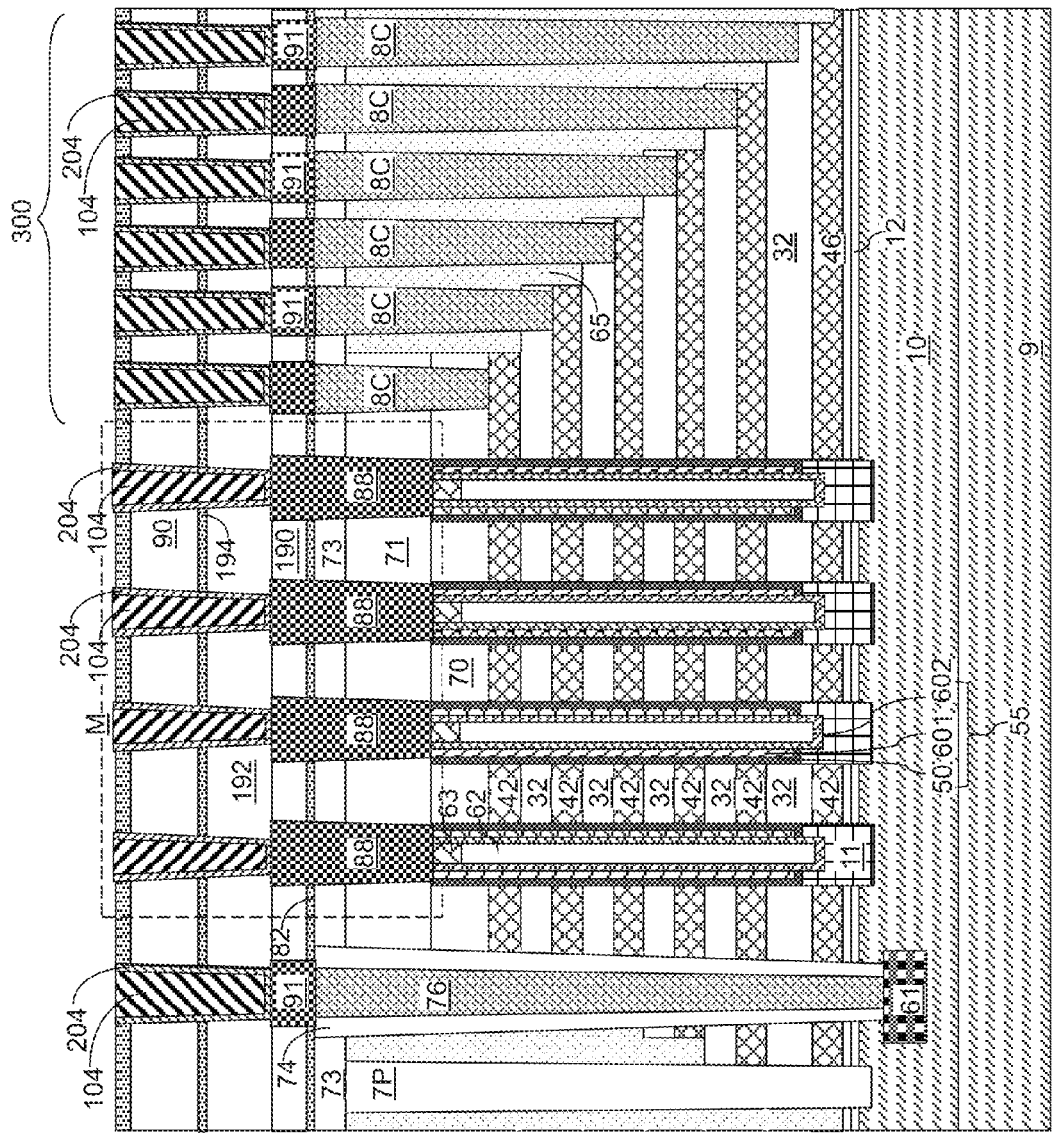
FIG. 17 is an alternate embodiment of the exemplary structure.

Referring to FIG. 17, an alternate embodiment of the exemplary structure is shown, in which the pitch of the integrated line and via structures (94, 194, 104, 204) can be the same as the pitch of the memory stack structures 55 and the pitch of the drain contact via structures 88. Various variations in the layout of the integrated line and via structures (94, 194, 104, 204) can be performed to optimize the wiring density and electrical connection to the memory stack structures 55. In one embodiment, the set of integrated line and via structures (94, 194, 104, 204) and underlying drain contact via structures 88 can have the same pitch along a horizontal direction that is perpendicular to the lengthwise direction of the line structures (94, 194) within the set of integrated line and via structures (94, 194, 104, 204).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising:
   at least one via level dielectric layer overlying a substrate;
   at least one line level dielectric layer located above the at least one via level dielectric layer; and
   an integrated line and via structure comprising a first line structure and a via structure in contact with each other, wherein:
   the first line structure comprises a conductive material contacting sidewalls of the at least one line level dielectric layer and a top surface of the at least one via level dielectric layer;
   the via structure comprises a conductive material contacting a sidewall of the at least one via level dielectric layer, a sidewall of the at least one line level dielectric layer, and a sidewall of the first line structure;
   the integrated line and via structure further comprises a second line structure contacting the conductive via liner and additional sidewalls of the at least one line level dielectric layer;
   the via structure is embedded between edge sidewalls of the first and the second line structures to electrically connect the first and the second line structures together to form a bit line;
   bottom surfaces of the first and the second line structures are located above a bottom surface of the via structure;
   a bottom surface of the via structure physically contacts an underlying device; and
   the bottom surfaces of the first and the second line structures do not physically contact the semiconductor or electrically conductive layer of the underlying device.

2. The structure of claim 1, wherein the via structure comprises:
   a conductive via liner contacting the sidewall of the at least one via level dielectric layer, the sidewall of the at least one line level dielectric layer, and the sidewall of the first line structure; and
   a conductive via fill material portion embedded within the conductive via liner, wherein the conductive via fill material portion is laterally spaced from each of the at least one via level dielectric layer, the at least one line level dielectric layer, and the first line structure by the conductive via liner.

3. The structure of claim 1, wherein a top surface of the via structure is coplanar with a top surface of the first line structure.

4. The structure of claim 1, wherein the first line structure and the second line structure laterally extend along a common lengthwise direction, and have a same vertical cross-sectional shape within vertical planes that are perpendicular to the common lengthwise direction.

5. The structure of claim 4, wherein the same vertical cross-sectional shape is a shape of a symmetric trapezoid.

6. The structure of claim 4, wherein a pair of sidewalls of the first line structure and a pair of sidewalls of the second line structure are located within a pair of planes including the common lengthwise direction as a horizontal direction.

7. The structure of claim 2, wherein the first line structure comprises:
   a conductive line liner contacting the sidewalls of the at least one line level dielectric layer; and
   a conductive line fill material portion embedded in the conductive line liner.

8. The structure of claim 7, wherein the conductive via liner contacts a sidewall of the conductive line fill material portion.

9. The structure of claim 7, wherein an end surface of the conductive line liner contacts an outer sidewall of the conductive via liner.

10. The structure of claim 9, wherein an upper periphery of a contact area between the end surface of the conductive line liner and the outer sidewall of the conductive via liner is coplanar with a top surface of the at least one line level dielectric layer.

11. The structure of claim 10, wherein a lower periphery of the contact area between the end surface of the conductive line liner and the outer sidewall of the conductive via liner is coplanar with a bottom surface of the first line structure.

12. The structure of claim 7, wherein an inner sidewall of the conductive via liner contacts the conductive via fill material portion and an outer sidewall of the conductive via liner contacts the conductive line fill material portion.

13. The structure of claim 7, wherein a top surface of the conducive via liner is coplanar with a top surface of the conductive line liner, and a bottom surface of the conductive via liner is located below a horizontal plane including a bottom surface of the conductive line liner.

14. The structure of claim 7, wherein the conductive via liner and the conductive line liner have different compositions or different thicknesses.

15. The structure of claim 7, wherein:
   the first and second line structures extend along a same lengthwise direction; and
   a top surface of the via structure has a same width as a top surface of the first line structure and as a top surface of the second line structure.

16. The structure of claim 7, wherein:
   the first and second line structures extend along a same lengthwise direction;
   a top surface of the first line structure and a top surface of the second line structure have a same width that is less than a width of a top surface of the via structure; and
   the via structure laterally protrudes symmetrically with respect to the first and second line structures.

17. The structure of claim 1, wherein:
the at least one line level dielectric layer comprises:
a dielectric cap layer having a top surface that is coplanar with a top surface of the integrated line and via structure; and
a dielectric material layer underlying the dielectric cap layer and having a different composition than the dielectric cap layer.

18. The structure of claim 1, further comprising:
a stack of alternating layers comprising electrically insulating layers and electrically conductive layers and located over the substrate and underneath the at least one via level dielectric layer;
a memory film; and
a semiconductor channel having at least a first channel portion extending substantially perpendicular to a top surface of the substrate.

19. The structure of claim 18, wherein:
the underlying device comprises a doped semiconductor region in contact with an upper part of the first channel portion and in electrical contact with the via structure;
the underlying device comprises a vertical NAND device located over the substrate; and
the electrically conductive layers comprise, or are electrically connected to, a respective word line of the NAND device.

20. The structure of claim 19, wherein:
the substrate comprises a silicon substrate;
the vertical NAND device comprises an array of monolithic three-dimensional NAND strings over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
each NAND string comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

21. A monolithic three-dimensional NAND memory device comprising:
a stack of alternating layers comprising electrically insulating layers and electrically conductive layers and located over a substrate;
a memory opening extending through the stack;
a memory film and a semiconductor channel located within the memory opening;
at least one via level dielectric layer overlying the stack;
at least one line level dielectric layer located above the at least one via level dielectric layer; and
an integrated line and via structure comprising a first line structure and a via structure in contact with each other, wherein:
the via structure comprises a conductive via liner contacting a sidewall of the at least one via level dielectric layer, a sidewall of the at least one line level dielectric layer, and a sidewall of the first line structure, and further comprises a conductive via fill material portion embedded within the conductive via liner,
wherein:
the integrated line and via structure further comprises a second line structure contacting the conductive via liner and additional sidewalls of the at least one line level dielectric layer;
the via structure is embedded between edge sidewalls of the first and the second line structures to electrically connect the first and the second line structures together to form a bit line;
bottom surfaces of the first and the second line structures are located above a bottom surface of the via structure;
a bottom surface of the via structure physically contacts a drain region of a NAND string which comprises a part of the monolithic three-dimensional NAND memory structure;
the bottom surfaces of the first and the second line structures do not physically contact the drain region of the NAND string; and
the electrically conductive layers comprise, or are electrically connected to, a respective word line of the NAND device.

22. The monolithic three-dimensional NAND memory structure of claim 21, wherein the first line structure contacts sidewalls of the at least one line level dielectric layer and a top surface of the at least one via level dielectric layer.

23. The monolithic three-dimensional NAND memory structure of claim 21, wherein the conductive via fill material portion is laterally spaced from each of the at least one via level dielectric layer, the at least one line level dielectric layer, and the first line structure by the conductive via liner.

24. The monolithic three-dimensional NAND memory structure of claim 21, wherein a top surface of the conductive via liner is coplanar with a top surface of the first line structure.

25. The monolithic three-dimensional NAND memory structure of claim 21, wherein the first line structure comprises:
a conductive line liner contacting the sidewalls of the at least one line level dielectric layer; and
a conductive line fill material portion embedded in the conductive line liner.

26. The monolithic three-dimensional NAND memory structure of claim 21, wherein:
the substrate comprises a silicon substrate;
the monolithic three-dimensional NAND memory structure comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
each monolithic three-dimensional NAND string comprises:
a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

27. The monolithic three-dimensional NAND memory device of claim 26, wherein:

each monolithic three-dimensional NAND string comprises a drain region contacting a respective semiconductor channel;

a plurality of integrated line and via structures are present over the array of monolithic three-dimensional NAND strings, each of the plurality of integrated line and via structures comprising a respective first line structure that extends along a lengthwise direction and at least one via structure in contact with the respective first line structure; and a plurality of drain contact via structures in contact with a top surface of a respective drain region, wherein the plurality of integrated line and via structures and the plurality of drain contact via structures have a same pitch along a horizontal direction that is perpendicular to the lengthwise direction of the first line structures of the plurality of integrated line and via structures.

28. A method of manufacturing a metal interconnect structure, comprising:

forming at least one via level dielectric layer over a substrate;

forming at least one line level dielectric layer over the at least one via level dielectric layer;

forming a line structure within the at least one line level dielectric layer;

forming a mask layer including an opening over the at least one line level dielectric layer and the line structure, the opening in the mask layer overlying a portion of the line structure;

forming a via cavity extending through the line structure and the at least one via level dielectric layer by etching a portion of the line structure underlying the opening and a portion of the at least one via level dielectric layer underlying the opening; and forming a via structure in the via cavity, wherein an integrated line and via structure comprising remaining portions of the line structure and the via structure is formed within a stack of the at least one via level dielectric layer and the at least one line level dielectric layer.

29. The method of claim 28, wherein forming the via cavity comprises anisotropically etching the portion of the line structure using a combination of the mask layer and the at least one line level dielectric layer as an etch mask.

30. The method of claim 29, wherein forming the via cavity further comprises anisotropically etching the portion of the at least one via level dielectric layer structure using the at least one line level dielectric layer as an etch mask.

31. The method of claim 30, wherein:

the mask layer comprises a patterned photoresist layer;

the at least one line level dielectric layer comprises a dielectric material layer and a dielectric cap layer overlying the dielectric material layer;

the dielectric cap layer comprises a different material than the at least one via level dielectric layer; and the portion of the at least one via level dielectric layer structure is etched selective to the dielectric cap layer.

32. The method of claim 28, wherein the line structure is formed by:

forming a line cavity in the at least one line level dielectric layer, the line cavity not extending into the at least one via level dielectric layer;

filling the line cavity with a conductive line liner material and a conductive line fill material; and removing portions of the conductive line liner material and the conductive line fill material from above a top surface of the at least one line level dielectric layer, wherein a remaining portion of the conductive line liner material constitutes a conductive line liner, a remaining portion of the conductive line fill material constitutes a conductive line fill material portion, and the conductive line liner and the conductive line fill material portion collectively constitute the line structure.

33. The method of claim 32, wherein a sidewall of a remaining portion of the conductive line liner and a sidewall of a remaining portion of the conductive line fill material portion are physically exposed in the via cavity.

34. The method of claim 33, wherein the via structure is formed by:

depositing a conductive via liner material and a conductive via fill material in the via cavity; and removing portions of the conductive via liner material and the conductive via fill material from above a top surface of the at least one line level dielectric layer, wherein a remaining portion of the conductive via liner material constitutes a conductive via liner, a remaining portion of the conductive via fill material constitutes a conductive via fill material portion, and the conductive via liner and the conductive via fill material portion collectively constitute the via structure.

35. The method of claim 34, wherein:

the at least one line level dielectric layer comprises a dielectric material layer and a dielectric cap layer overlying the dielectric material layer;

the removed portions of the conductive line liner material and the conductive line fill material are removed by a first planarization process employing the dielectric cap layer as a stopping layer; and the removed portions of the conductive via liner material and the conductive via fill material are removed by a second planarization process employing the dielectric cap layer as a stopping layer.

36. The method of claim 28, wherein the remaining portions of the line structure comprises:

a first line structure comprising a first line liner and a first conductive line fill material portion; and a second line structure comprising a second line liner and a second conductive line fill material portion;

wherein the via structure is formed on a sidewall of the first line liner, a sidewall of the first conductive line fill material portion, a sidewall of the second line liner, and a sidewall of the second conductive line fill material portion.

37. The method of claim 36, wherein the via structure is formed by:

depositing a conductive via liner material on the sidewall of the first line liner, the sidewall of the first conductive line fill material portion, the sidewall of the second line liner, and the sidewall of the second conductive line fill material portion;

depositing a conductive via fill material on the deposited conductive via liner material; and removing portions of the conductive via liner material and the conductive via fill material from above a top surface of the at least one line level dielectric layer, wherein:
a remaining portion of the conductive via liner material constitutes a conductive via liner;
a remaining portion of the conductive via fill material constitutes a conductive via fill material portion;
the conductive via liner and the conductive via fill material portion collectively constitute the via structure.

38. The method of claim 28, further comprising:
forming a stack of alternating layers comprising insulator layers and electrically conductive layers over the substrate;
forming a memory opening through the stack;
forming a memory film and a semiconductor channel material in the memory opening; and
forming a drain region over the semiconductor channel material;
wherein the at least one via level dielectric layer is formed over the stack and the via structure contacts the drain region.

39. The method of claim 38, wherein:
the memory film and the semiconductor channel comprise a portion of a vertical NAND device; and
the electrically conductive layers in the stack comprises, or are electrically connected to, a respective word line of the vertical NAND device.

40. The method of claim 39, wherein:
the NAND device comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive portions in the stack comprise, or are in electrical contact with, the plurality of control gate electrodes and extend from the device region to a contact region containing the plurality of electrically conductive via connections; and
the substrate comprises a silicon substrate containing a driver circuit for the NAND device.

* * * * *